(12) United States Patent
Jing et al.

(10) Patent No.: US 12,324,299 B2
(45) Date of Patent: Jun. 3, 2025

(54) ORGANIC LIGHT-EMITTING DEVICE, A MANUFACTURING METHOD AND DISPLAY DEVICE

(71) Applicant: BOE TECHNOLOGY GROUP CO., LTD., Beijing (CN)

(72) Inventors: Shu Jing, Beijing (CN); Xiaobo Du, Beijing (CN); Zhihui Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 881 days.

(21) Appl. No.: 17/519,722

(22) Filed: Nov. 5, 2021

(65) Prior Publication Data
US 2022/0310931 A1    Sep. 29, 2022

(30) Foreign Application Priority Data
Mar. 29, 2021    (CN) .......................... 202110336638.2

(51) Int. Cl.
| | |
|---|---|
| H01L 51/00 | (2006.01) |
| H10K 50/11 | (2023.01) |
| H10K 59/80 | (2023.01) |
| H10K 85/30 | (2023.01) |
| H10K 85/60 | (2023.01) |

(Continued)

(52) U.S. Cl.
CPC ........... *H10K 50/11* (2023.02); *H10K 59/876* (2023.02); *H10K 85/342* (2023.02); *H10K 85/626* (2023.02); *H10K 85/631* (2023.02); *H10K 85/654* (2023.02); *H10K 85/6572* (2023.02); *H10K 50/125* (2023.02); *H10K 71/00* (2023.02);

(Continued)

(58) Field of Classification Search
None
See application file for complete search history.

(56) References Cited

U.S. PATENT DOCUMENTS

2015/0115245 A1    4/2015    Archer

FOREIGN PATENT DOCUMENTS

| CN | 100379049 C | * | 4/2008 |
|---|---|---|---|
| CN | 102983284 A | | 3/2013 |

(Continued)

OTHER PUBLICATIONS

China Patent Office, First Office Action issued May 31, 2022 for application No. CN202110336638.2.

*Primary Examiner* — Tae H Yoon
(74) *Attorney, Agent, or Firm* — HOUTTEMAN LAW LLC

(57) ABSTRACT

An organic light-emitting device, a manufacturing method and a display device are provided. The organic light-emitting device includes: a first electrode and a second electrode that are arranged oppositely; at least two light-emitting layers located between the first electrode and the second electrode, the at least two light-emitting layers include a first light-emitting layer and a second light-emitting layer that are stacked alternately. The first light-emitting layer is a blue light-emitting layer, the first light-emitting layer is doped with a first dopant material, and the second light-emitting layer is doped with a second dopant material. The first dopant material includes a blue light-emitting material with triplet-triplet annihilation effect, and the triplet energy level of the first dopant material is higher than the triplet energy level of the second dopant material.

17 Claims, 7 Drawing Sheets

(51) Int. Cl.
*H10K 50/125* (2023.01)
*H10K 71/00* (2023.01)
*H10K 101/00* (2023.01)
*H10K 101/10* (2023.01)

(52) U.S. Cl.
CPC ..... *H10K 2101/10* (2023.02); *H10K 2101/90* (2023.02)

(56) References Cited

FOREIGN PATENT DOCUMENTS

| | | | |
|---|---|---|---|
| CN | 104124391 A | | 10/2014 |
| CN | 107425127 A | | 12/2017 |
| CN | 108269937 A | | 7/2018 |
| CN | 107293645 B | | 12/2019 |
| CN | 110600632 A | | 12/2019 |
| TW | 200803606 A | * | 1/2008 |
| TW | I138965 B | * | 2/2012 |
| TW | 201213897 A1 | * | 4/2012 |
| WO | WO 2020/180425 A1 | * | 9/2020 |

* cited by examiner

| Brightness | Voltage | Current efficiency | CIE-x | CIE-y |
|---|---|---|---|---|
| 2000 | 4.5 | 25.84 | 0.3512 | 0.3585 |

Figure 3

| Brightness | Voltage | Current efficiency | CIE-x | CIE-y |
|---|---|---|---|---|
| 2000 | 4.9 | 18.86 | 0.2807 | 0.3052 |

Figure 5

ORGANIC LIGHT-EMITTING DEVICE, A MANUFACTURING METHOD AND DISPLAY DEVICE

CROSS-REFERENCE TO RELATED APPLICATION

This application claims a priority to Chinese Patent Application No. 202110336638.2 entitled with "A WHITE LIGHT ORGANIC LIGHT-EMITTING DEVICE, A MANUFACTURING METHOD AND DISPLAY DEVICE", submitted on Mar. 29, 2021, the disclosure of which is incorporated herein in its entirety by reference.

TECHNICAL FIELD

The present disclosure relates to a field of display technology, in particular an organic light-emitting device, a manufacturing method, and a display device.

BACKGROUND

A typical example of an organic light-emitting device is a white light organic light-emitting device. White light organic light-emitting device, also known as white light organic light-emitting diodes (referred to simply as OLED), is an organic light-emitting device that emits white light, which can be used as a light source or a backlight for liquid crystal displays and full-color displays, and has great application potential in the field of lighting and display.

At present, among white light OLEDs, red and green light-emitting materials have met industrial requirements. However, due to its own wide band gap, blue light-emitting materials are still far from practical use in terms of color purity and lifetime stability. For example, in the existing white light OLED in which the blue light-emitting layer coexists with the green and red light-emitting layers, the color of the white light emitted by the white light OLED becomes yellowish due to the low light-emitting efficiency of the blue light-emitting material.

SUMMARY

The embodiments of the present disclosure provide an organic light-emitting device, a manufacturing method, and a display device, for improving the light-emitting efficiency of blue light-emitting materials in an organic light-emitting device (for example, a white light organic light-emitting device).

A first aspect provides an organic light-emitting device, comprising: a first electrode and a second electrode arranged oppositely; and at least two light-emitting layers between the first electrode and the second electrode. The at least two light-emitting layers include a first light-emitting layer and a second light-emitting layer that are stacked alternately; wherein the first light-emitting layer is a blue light-emitting layer, and the first light-emitting layer is doped with a first dopant material; the second light-emitting layer is doped with a second dopant material. The first dopant material includes a blue light-emitting material with triplet-triplet annihilation effect, and the triplet energy level of the first dopant material is higher than the triplet energy level of the second dopant material.

In some embodiments, the second light-emitting layer is selected from a group consisting of a yellow light-emitting layer, a red light-emitting layer, and an orange light-emitting layer.

In some embodiments, the at least two light-emitting layers have a layer number of an odd number.

In some embodiments, the at least two light-emitting layers comprise: the first light-emitting layer, the second light-emitting layer, and the first light-emitting layer that are stacked sequentially; alternatively, the second light-emitting layer, the first light-emitting layer, and the second light-emitting layer that are stacked sequentially.

In some embodiments, the triplet energy level of the first dopant material is greater than or equal to 2.2 eV.

In some embodiments, the first dopant material is at least one selected from the group consisting of compounds represented by any of the following structural formulas:

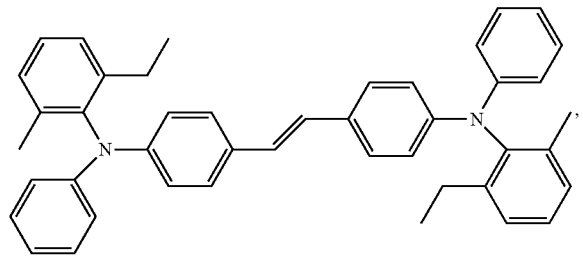

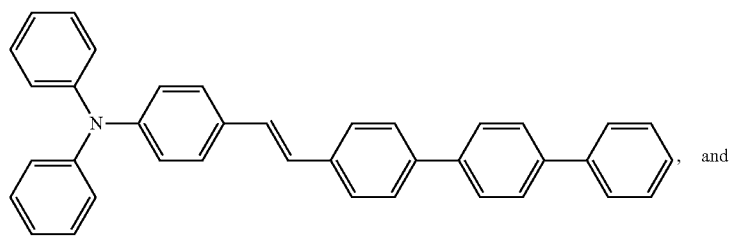

, and

-continued

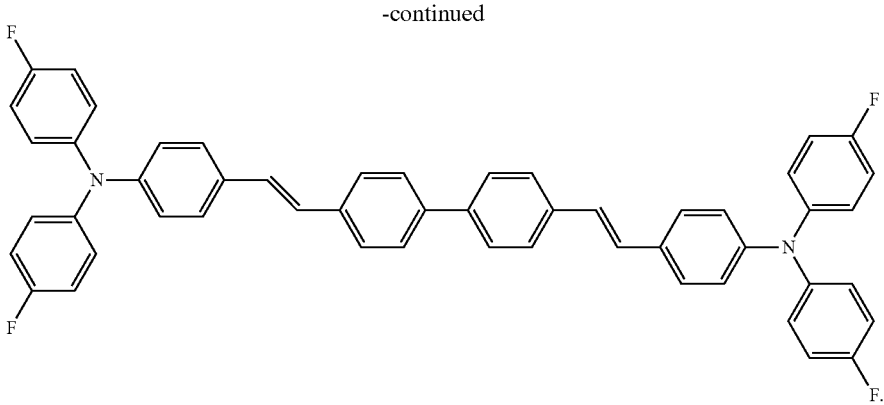

In some embodiments, the second dopant material is at least one selected from the group consisting of compounds represented by any of the following structural formulas

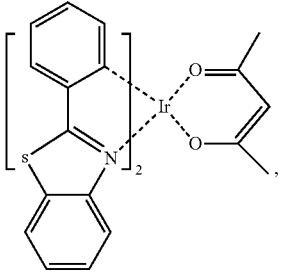

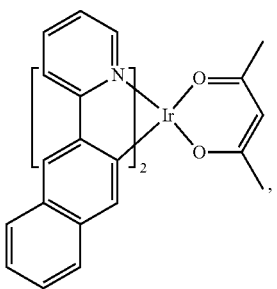

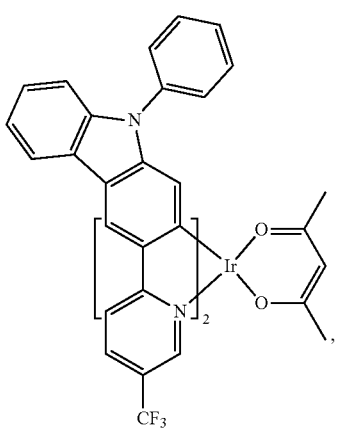

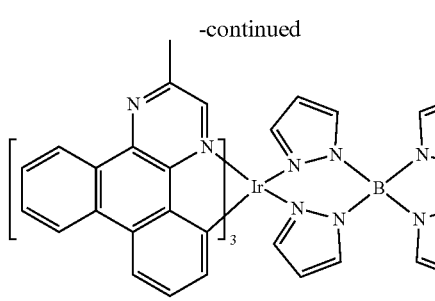

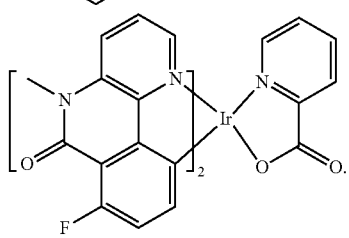

, and

In some embodiments, the first electrode includes a reflective layer.

Alternatively, the organic light-emitting device further comprises a reflective layer located on a side of the first electrode away from the second electrode; and the second electrode is a semi-transparent electrode.

In some embodiments, a distance Lo between the reflective layer and the semi-transparent electrode satisfies: $k \cdot \lambda/2 = La + Lc + n_1 \cdot Lo$, wherein La is a penetration depth on the reflective layer side due to the reflective phase shift of the reflective layer, Lc is a penetration depth on the second electrode side due to the reflective phase shift of the second electrode, k is an integer, $\lambda$ is a peak wavelength of a blue light emitted by the first light-emitting layer, and $n_1$ is a refractive index of all layers between the reflective layer and the semi-transparent electrode.

In some embodiments, a distance Lo1 between the reflective layer and the first light-emitting layer closest to the reflective layer among the at least two light-emitting layers satisfies: $k \cdot \lambda/4 = La + n_2 \cdot Lo1$, wherein La is a penetration depth of the reflective layer side due to a reflection phase shift of the reflective layer, k is an integer, $\lambda$ is a peak wavelength of a blue light emitted by the first light-emitting layer, and $n_2$ is a refractive index of all layers between the reflective layer and the first light-emitting layer.

In some embodiments, the organic light-emitting device further comprises: at least one selected from a group consisting of a hole injection layer, a hole transport layer, a hole blocking layer, an electron transport layer, and an electron injection layer.

In some embodiments, a light-outgoing layer is provided on the second electrode.

In some embodiments, the first light-emitting layer further comprises a first host material, the first dopant material is doped in the first host material, and the first host material is selected from one or a mixture of several of the compounds represented by any of the following structural formulas:

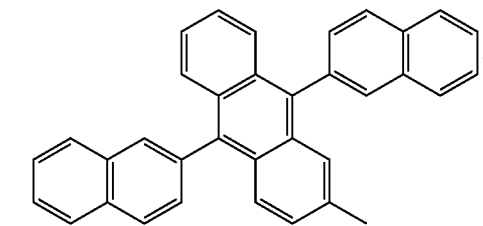

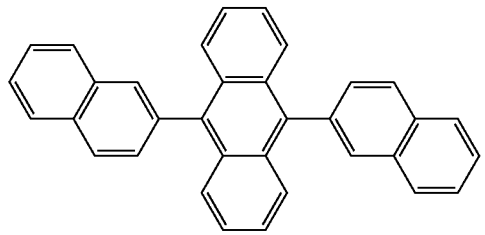, and

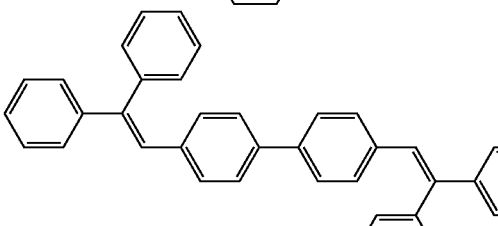

In some embodiments, the second light-emitting layer further comprises a second host material, the second dopant material is doped in the second host material, and the second host material is selected from one or a mixture of several of the compounds represented by any of the following structural formulas:

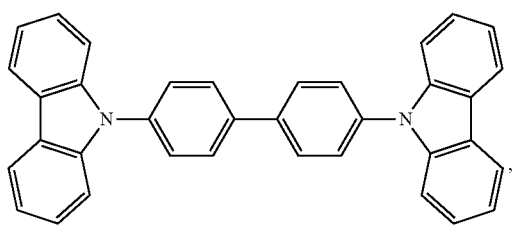

-continued

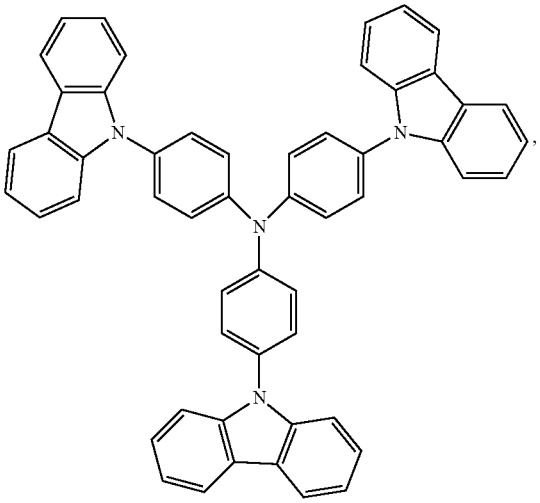,

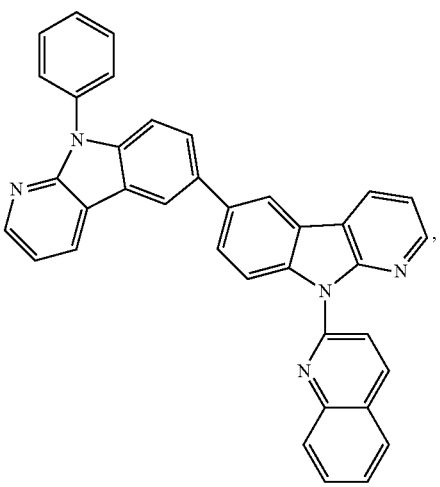,

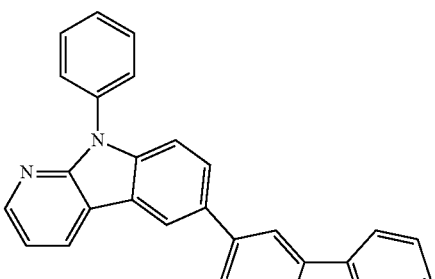,

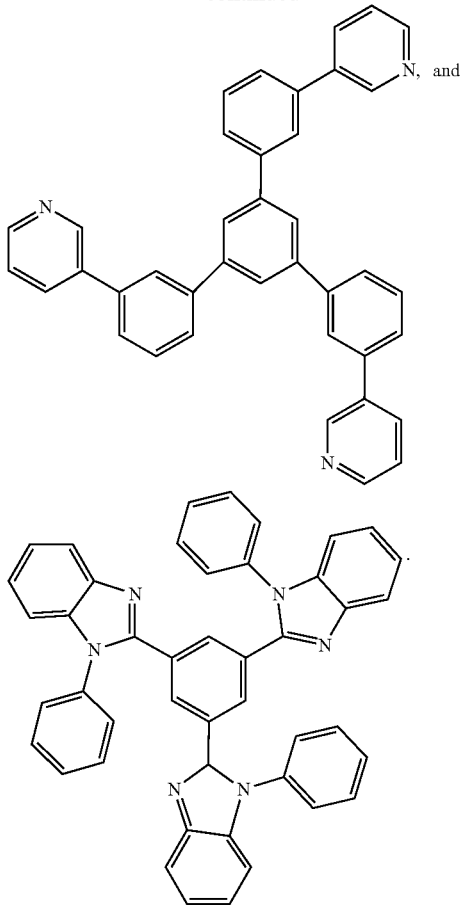

In some embodiments, the organic light-emitting device is a white light organic light-emitting device, and the white light organic light-emitting device comprises the first electrode, a hole injection layer, a hole transport layer, the second light-emitting layer, the first light-emitting layer, the second light-emitting layer, a hole blocking layer, an electron transport layer, an electron injection layer, the second electrode and the light-outgoing layer sequentially arranged on a substrate.

A second aspect provides a display device comprising the organic light-emitting device provided in any of the above embodiments.

In some embodiments, the organic light-emitting device is a white light organic light-emitting device, the display device has a display panel of an organic light-emitting diode display panel, and the organic light-emitting diode display panel comprises a plurality of the white light organic light-emitting devices.

In some embodiments, the organic light-emitting device is a white light organic light-emitting device, the display device comprises a liquid crystal display panel and a backlight source for providing a backlight for the liquid crystal display panel, and the backlight source includes a plurality of the white light organic light-emitting devices.

A third aspect provides a method for preparing an organic light-emitting device, comprising the following steps: forming a first electrode on a substrate; forming at least two light-emitting layers on the substrate including the first electrode, the at least two light-emitting layers including: a first light-emitting layer and a second light-emitting layer that are stacked alternately; forming a second electrode on the substrate including the at least two light-emitting layers; wherein, the first light-emitting layer is a blue light-emitting layer, the blue light-emitting layer is doped with a first dopant material; the second light-emitting layer is doped with a second dopant material; the first dopant material includes a blue light-emitting material with triplet-triplet annihilation effect; and the triplet energy level of the first dopant material is higher than the triplet energy level of the second dopant material.

The organic light-emitting device (for example, white light organic light-emitting device) provided by the embodiments of the present disclosure uses a blue light-emitting material with triplet-triplet annihilation (TTA) effect. Compared with blue phosphorescent materials and thermally activated delayed fluorescence (TADF) blue light-emitting materials with thermally activated delayed fluorescence characteristics, the blue light-emitting materials with TTA effect have a longer lifetime and can achieve a high light-emitting efficiency under high brightness. Moreover, in the white organic light-emitting device provided by the embodiments of the present disclosure, the first dopant material is doped in the blue light-emitting layer, that is, the triplet energy level of the blue light-emitting material is higher than that of the second dopant material in the second light-emitting layer. As such, the triplet energy of the second dopant material can be prevented from being transferred to the blue light-emitting material and quenched without using a spacer layer, so that the triplet state of the blue light-emitting material with TTA effect has increased exciton utilization rate, thereby improving the blue light-emitting efficiency of the device, and simplifying the manufacturing process of the device.

Understandably, the display device described in the second aspect includes the organic light-emitting device described above, and the method for preparing the organic light-emitting device described in the third aspect is used to prepare the organic light-emitting device described above. Therefore, the beneficial effects achieved by the second and third aspects can refer to the beneficial effects of the organic light-emitting device mentioned above, which will not be repeated here.

BRIEF DESCRIPTION OF DRAWINGS

In accordance with various disclosed embodiments, the following figures are merely examples for illustrative purposes and are not intended to limit the scope of the disclosure:

FIG. 3 is a schematic diagram of a performance test result of an organic light-emitting device provided by an embodiment of the disclosure;

FIG. 5 is a schematic diagram of a performance test result of another organic light-emitting device provided by an embodiment of the disclosure.

DETAIL DESCRIPTION OF EMBODIMENTS

Figure 1:
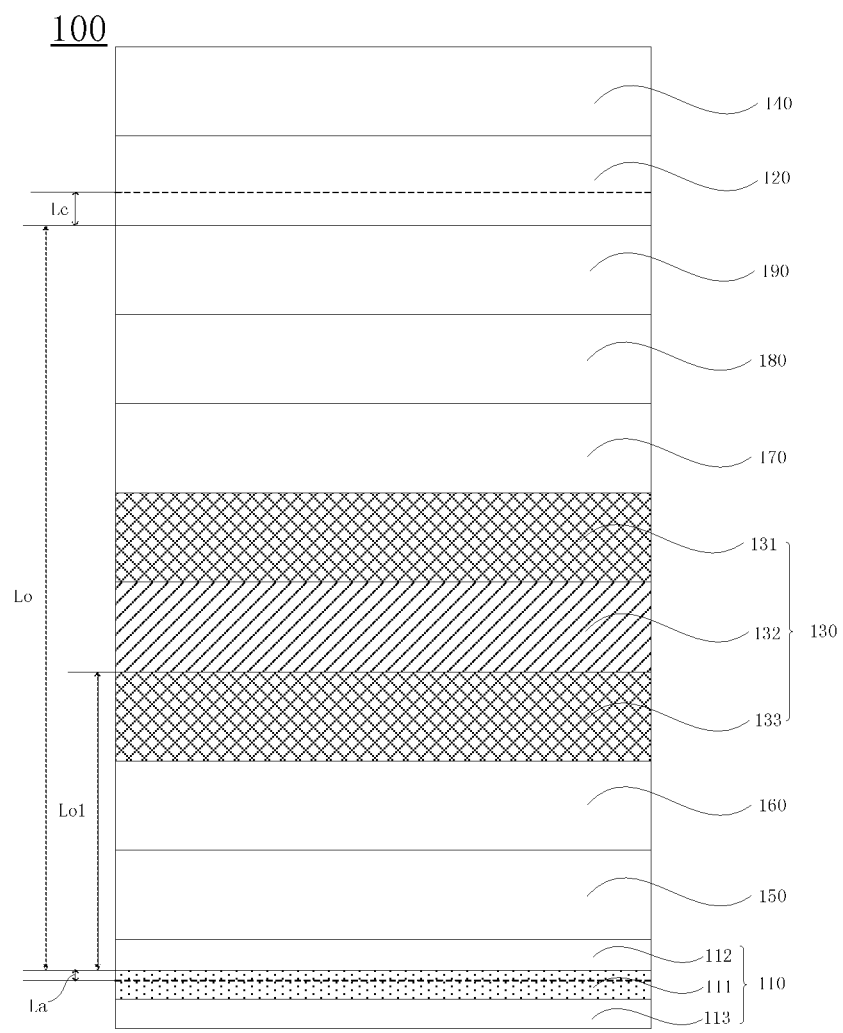
FIG. 1 is a structural diagram of an organic light-emitting device provided by an embodiment of the disclosure.

The technical solutions in the embodiments of the present disclosure will be clearly and completely described below in combination with the accompanying drawings in the embodiments of the present disclosure. Obviously, the described embodiments are only a part of the embodiments of the present disclosure, rather than all the embodiments. Based on the embodiments in the present disclosure, all other embodiments obtained by those of ordinary skill in the art without creative work shall fall within the protection scope of the present disclosure.

In the description of the present disclosure, it should be understood that the orientation or positional relationship indicated by the terms "center", "on", "below", "front", "behind", "left", "right", "vertical", "horizontal", "top", "bottom", "inner", "outer", etc. is based on the orientation or positional relationship shown in the drawings, and is only for the convenience of describing the present disclosure and simplifying the description, rather than indicating or implying the referred device or element must have a specific orientation and must be configured and operated in a specific orientation, and therefore cannot be understood as a limitation to the present disclosure.

Unless the context requires otherwise, the term "comprise" and other forms such as the third-person singular form "comprises" and the present participle form "comprising" are used in an open-ended manner throughout the specification and claims, meaning "including, but not limited to". In the description of the specification, the terms "one embodiment", "some embodiments", "exemplary embodiments", "examples", "specific examples" and "some examples" are intended to indicate that a specific feature, structure, material, or characteristic related to the embodiment or example is included in at least one embodiment or example of the present disclosure. The demonstrative representations of the above terms do not necessarily refer to the same embodiment or example. In addition, the specific features, structures, materials, or characteristics described may be included in any one or more embodiments or examples in any suitable manner.

Hereinafter, the terms "first" and "second" are only used for descriptive purposes, and cannot be understood as indicating or implying relative importance or implicitly indicating the number of indicated technical features. Thus, the features defined with "first" and "second" may explicitly or implicitly include one or more of these features. In the description of the embodiments of the present disclosure, unless otherwise specified, "plurality" means two or more.

In describing some embodiments, the expressions "coupled" and "connected" and their extensions may be used. For example, the term "connected" may be used when describing some embodiments to indicate that two or more components are in direct physical or electrical contact with each other. As another example, the term "coupled" may be used when describing some embodiments to indicate that two or more components have direct physical or electrical contact. However, the term "coupled" or "communicatively coupled" may also mean that two or more components are not in direct contact with each other, but still cooperate or interact with each other. The embodiments disclosed herein are not necessarily limited to the content herein.

As used herein, "at least one of A, B and C" and "at least one of A, B or C" have the same meaning, and both include the following combinations of A, B and C: only A, only B, only C, the combination of A and B, the combination of A and C, the combination of B and C, and the combination of A, B and C.

As used herein, "Group A and/or Group B, including the following three combinations: only A, only B, and a combination of A and B.

As used herein, "a plurality of" means at least two.

As used herein, "applicable to" or "configured to" means open-ended and inclusive language, which does not exclude devices suitable for or configured to perform additional tasks or steps.

In addition, the use of "based on" means openness and inclusiveness, because processes, steps, calculations or other actions "based on" one or more of the stated conditions or values may be based on additional conditions or exceed the stated values in practice.

As used herein, "about", "approximately" or "substantially" includes the stated value as well as the average value within the acceptable deviation range of the specified value, wherein the acceptable deviation range is determined by those of ordinary skill in the art taking into account the measurement in question and the error associated with the measurement of a specific quantity (i.e., the limitations of the measurement system).

The exemplary embodiments are described herein with reference to cross-sectional views and/or plan views as idealized exemplary drawings. In the drawings, the thickness of layers and regions are exaggerated for clarity. Therefore, variations in the shape with respect to the drawings due to, for example, manufacturing technology and/or tolerances can be envisaged. Therefore, the exemplary embodiments should not be construed as being limited to the shape of the region shown herein, but include shape deviations due to, for example, manufacturing. For example, the etched region shown as a rectangle will generally have curved features. Therefore, the region shown in the drawings are schematic in nature, and their shapes are not intended to show the actual shape of the region of the device, and are not intended to limit the scope of the exemplary embodiments.

The embodiment of the present disclosure provides an organic light-emitting device (OLED). FIG. 1 shows the structure of an organic light-emitting device 100 provided by some embodiments of the present disclosure. As shown in FIG. 1, the organic light-emitting device 100 includes a first electrode 110 and a second electrode 120 disposed opposite to each other, and at least two light-emitting layers 130 between the first electrode 110 and the second electrode 120.

In some embodiments, the organic light-emitting device (OLED) is a white light OLED. The white light OLED may include a plurality of light-emitting layers. By doping the light-emitting materials of different colors (for example, red light-emitting materials, green light-emitting materials, and blue light-emitting materials) into the corresponding host materials, respectively, the plurality of light-emitting layers that can emit light of different colors are formed. These light-emitting layers are stacked together to form the light-emitting layer structure of the white light OLED.

In some embodiments, with reference to FIG. 1, the light-emitting layer 130 includes a first light-emitting layer 132 and a second light-emitting layer (for example, including a second light-emitting layer 131 and a second light-emitting layer 133) that are stacked alternately. The first light-emitting layer 132 is a blue light-emitting layer and emits blue light. The first light-emitting layer 132 is doped with a first dopant material. Exemplarily, the first light-emitting layer 132 includes a first host material and the first dopant material. The first dopant material may be doped in the first host material. The emission color of the second light-emitting layer (hereinafter referred to as the second color) is different from the emission color of the first light-emitting 132. By controlling the brightness of the second color light and the blue light that can be emitted from the organic light-emitting device 100, the organic light-emitting device 100 can emit white light. For example, the second color is a complementary color of blue color. Exemplarily, the second color is red, orange, or yellow. Accordingly, the second light-emitting layer (for example, including the second light-emitting layer 131 and the second light-emitting layer 133) is a red light-emitting layer, an orange light-emitting layer, or a yellow light-emitting layer.

In some embodiments, the second color is yellow, and the second light-emitting layer (for example, the second light-emitting layer 131 and the second light-emitting layer 133) is a yellow light-emitting layer. The second light-emitting layer is doped with a second dopant material. For example, the second light-emitting layer 131 and the second light-emitting layer 133 include a second host material and the second dopant material.

In order to improve the light-emitting efficiency of the blue light-emitting material in the organic light-emitting device, a highly efficient blue light-emitting material can be used. The development of the highly efficient blue light-emitting material may include three directions. One is to develop blue phosphorescent materials, which can achieve 100% quantum efficiency. However, the blue phosphorescent OLEDs have a short lifetime and are not practical. Another direction is to develop TADF blue light-emitting materials with thermally activated delayed fluorescence (TADF) characteristics. The TADF blue light-emitting materials reduce the energy gap between singlet and triplet states through reasonable molecular design, achieve the effective reverse intersystem crossing from triplet state to singlet state, and also achieve the purpose of using triplet excitons. However, the TADF blue light-emitting material has the problem of serious degradation of device efficiency under high brightness, and the lifetime of the TADF blue light-emitting material is relatively poor, which makes the overall lifetime of the white light OLED shorter. In order to make full use of the triplet state of blue light-emitting materials and improve the light-emitting efficiency of blue light-emitting materials, a fluorescent material with triplet-triplet annihilation (TTA) effect has also been developed for emission of blue light. TTA can annihilate two triplet excitons to form a singlet exciton, thereby improving the efficiency of the device. Theoretically, the internal quantum efficiency of OLEDs can reach 40% to 62.5% by using blue light-emitting materials with the TTA effect.

In some embodiments, the first dopant material includes a blue light-emitting material with triplet-triplet annihilation effect. Compared with blue phosphorescent materials and TADF blue light-emitting materials with thermally activated delayed fluorescence characteristics, the blue light-emitting materials with TTA effect have a longer lifetime and can achieve high light-emitting efficiency under high brightness.

The triplet-triplet annihilation is based on the mechanism in which two triplet excitons collide with each other to generate a singlet exciton, which can effectively convert the triplet exciton into singlet state for light emission. Since the first light-emitting layer 132 is adjacent to the second light-emitting layer (for example, adjacent to the second light-emitting layer 131 and the second light-emitting layer 133), the triplet energy level of the second dopant material doped in the second light-emitting layer will be transferred to the blue light-emitting material of the first light-emitting layer 132, leading to the quenching of the triplet excitons in the blue light-emitting material of the first light-emitting layer 132, so that both of the utilization rate of the triplet excitons in the blue light-emitting material of the first light-emitting layer 132 and the light-emitting efficiency of the device emitting blue light decrease.

The "light-emitting efficiency" described herein is the main indicator for evaluating OLED devices, which can be characterized by at least one of quantum efficiency, power efficiency, and current efficiency. Among them, the quantum efficiency is the ratio of the number of photons generated by the OLED device to the total number of injected carriers, which may be divided into internal quantum efficiency and external quantum efficiency, with the unit of %. The external quantum efficiency refers to the ratio of the total number of photons emitted by the device to the number of injected carriers; and the internal quantum efficiency refers to the ratio of the total number of photons generated in the device to the number of injected carriers. The current efficiency refers to the ratio of the light-emitting brightness of the device to the current density, and the unit is candela per ampere ($cd \cdot A^{-1}$). The power efficiency refers to the ratio of the optical power output by the device to the input power, and the unit is lumens per watt ($lm \cdot W^{-1}$).

In some embodiments, the triplet energy level of the first dopant material is higher than the triplet energy level of the second dopant material. When the triplet energy level of the first dopant material (i.e., the blue light-emitting material doped in the first light-emitting layer) is higher than the triplet energy level of the second dopant material in the second light-emitting layer, the energy of the triplet energy level of the second dopant material can be prevented from being transferred to the blue light-emitting material, so that the triplet exciton utilization rate in the blue light-emitting material is higher, the internal quantum efficiency is improved, and the light-emitting efficiency is higher for the device emitting blue light.

In some embodiments, the second light-emitting layer includes a second light-emitting layer 131 and a second light-emitting layer 133, and both of the second light-emitting layer 131 and the second light-emitting layer 133 are yellow light-emitting layers. The second light-emitting layer 131 and the second light-emitting layer 133 may include a second host material and a second dopant material. Among others, the second dopant material is at least one selected from the compounds represented by any of the following structural formulas, which have a peak wavelength of intrinsic spectrum of between 550 nm and 580 nm:

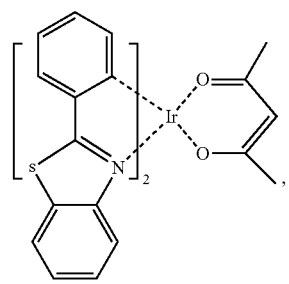

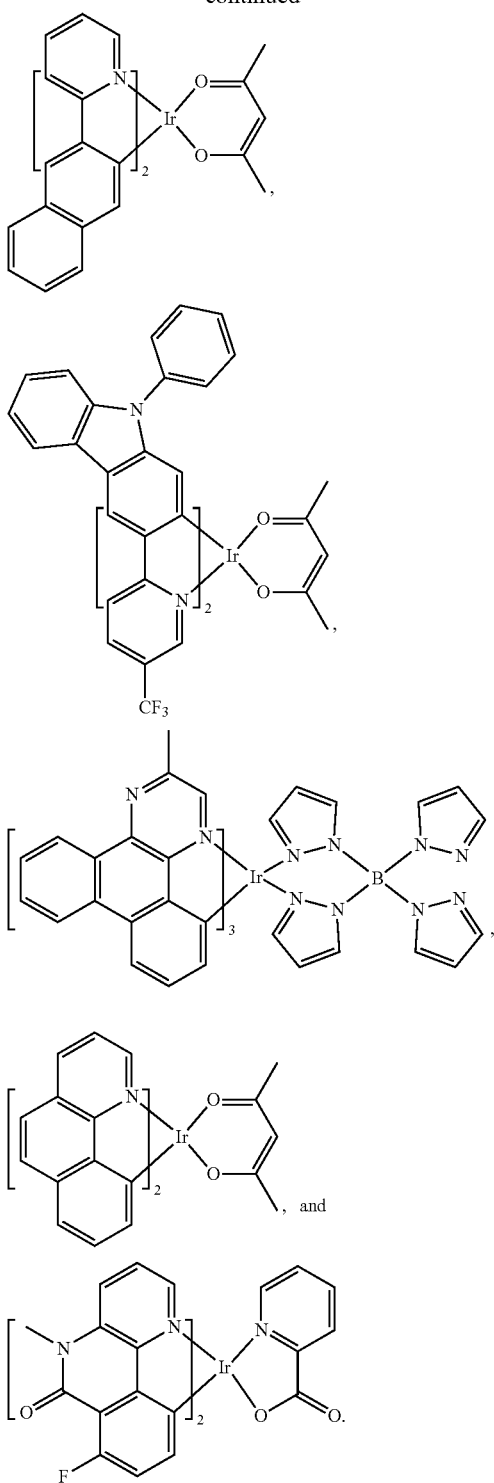

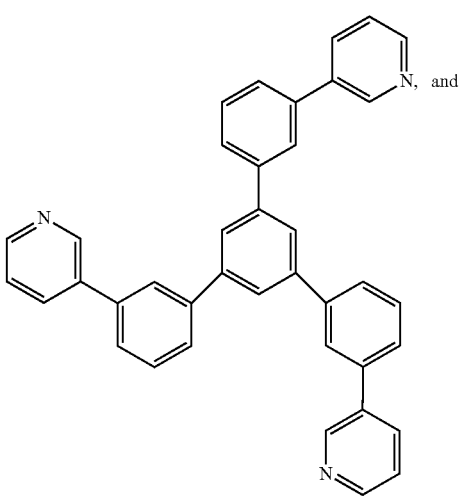

The yellow light host 2 is one selected from the compounds represented by any of the following structural formulas:

The second host material may be a mixture of the yellow host 1 and the yellow host 2. Exemplarily, the yellow host is a pre-mixed material. For example, the yellow host is a pre-mixed material with an exciplex mechanism and the peak wavelength of the intrinsic spectrum thereof is between 530 nm and 560 nm. Among them, the yellow light host 1 is one selected from the compounds represented by any of the following structural formulas:

-continued

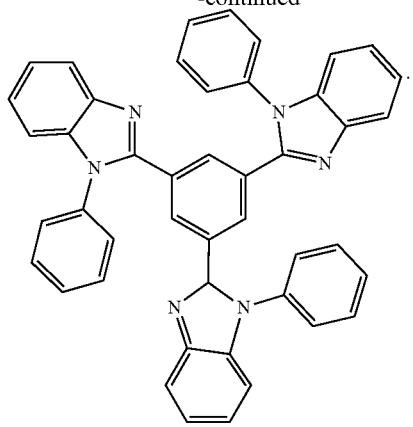

The second host material may also be a non-premixed material. For example, the second host material is one or a mixture of several selected from the compounds represented by any of the following structural formulas:

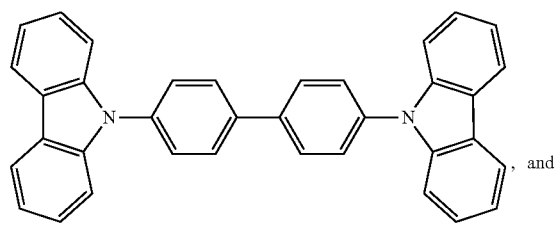, and

-continued

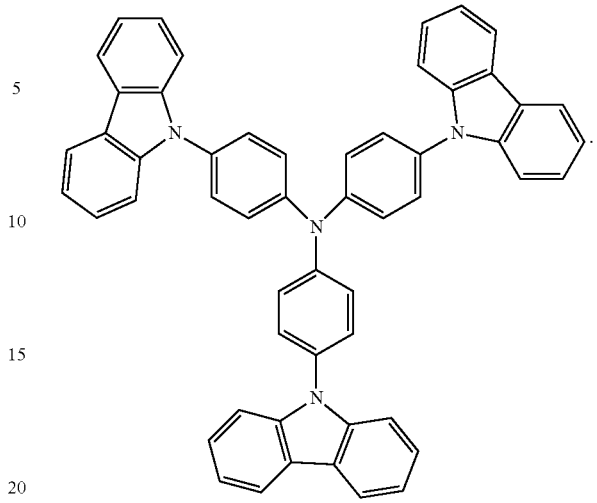

In some embodiments, the triplet energy level of the first dopant material is greater than or equal to 2.2 eV. When the second dopant material illustrated above is used as the yellow light-emitting material and the triplet energy level of the first dopant material is greater than or equal to 2.2 eV, the triplet energy level of the first dopant material is higher than that of the second dopant material. Exemplarily, the first dopant material is one selected from the compounds represented by any of the following structural formulas, and the peak wavelength of intrinsic spectrum of these compounds is about 465 nm:

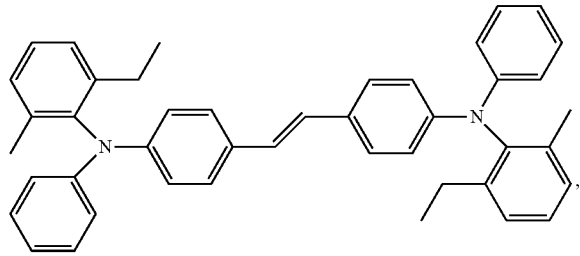,

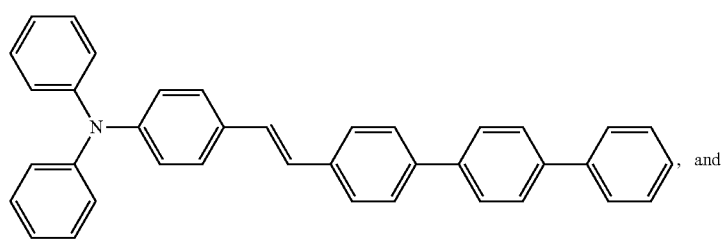, and

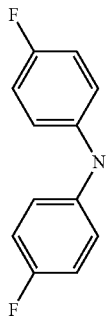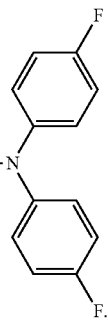

In some embodiments, the first host material is selected from one or a mixture of several of the compounds represented by any of the following structural formulas:

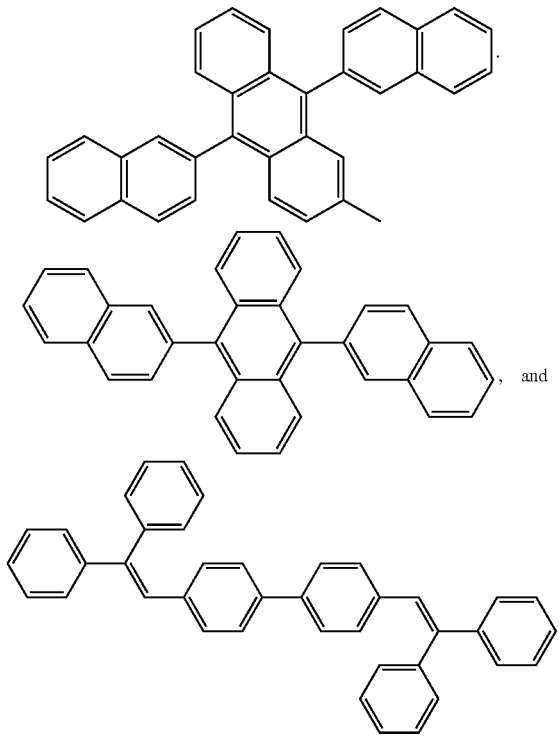

, and

In some embodiments, the number of the light-emitting layers 130 is an odd number. When the organic light-emitting device 100 emits light, the electrons and holes are respectively injected from the cathode and the anode, and meet in the light-emitting layer 130, and recombine to generate excitons, in which the radiation of the excitons decays to generate photons. When the carriers recombine in the first light-emitting layer (such as the first light-emitting layer 132) to generate excitons, the first light-emitting layer emits blue light; and when the carriers recombine in the second light-emitting layer (such as the second light-emitting layer 131 or the second light-emitting layer 133) to produce excitons, the second light-emitting layer emits a light of the second color. Generally speaking, in the OLED organic materials, the mobility of holes is faster than that of electrons, so the carrier recombination region is usually near the light-emitting layer on the side adjacent to the cathode. In addition, the charge mobility of the material changes with the voltage, and the change trend of the electron mobility is significantly different from that of the hole mobility. The electron mobility increases faster with the voltage than the hole mobility with the voltage. Therefore, in the organic light-emitting device 100, as the driving voltage increases, the carrier recombination region moves from the light-emitting layer on the side adjacent to the cathode to the light-emitting layer on the side adjacent to the anode. For example, under a lower driving voltage, the carrier recombination region is mainly located in the light-emitting layer adjacent to the cathode. The carrier recombination phenomenon also exists in other light-emitting layers, but compared to the light-emitting layer adjacent to the cathode, the amount of carrier recombination is less in other light-emitting layers, the amount of the excitons generated is less, and the amount of light emitted in the corresponding light-emitting layer is also less. As the driving voltage gradually increases, the carrier recombination region moves to the anode, moving from one light-emitting layer to another light-emitting layer, so that the number of excitons in different light-emitting layers will increase in one light-emitting layer and decrease in another light-emitting layer, and the contribution ratio changes for blue and second color, so that the color of the white light emitted by the organic electroluminescent device 100 changes, and the color coordinate of the white light changes. Since in the organic light-emitting device 100 provided by the embodiment of the present disclosure, the first light-emitting layer and the second light-emitting layer are stacked alternately, the two light-emitting layers are arranged in a symmetrical manner centered with the central light-emitting layer when the number of the light-emitting layers 130 is an odd number. Exemplarily, for the sake of simplifying the structure of the device, the number is 3 for the light-emitting layers 130. In this case, the organic light-emitting device 100 includes three light-emitting layers 130 stacked sequentially. For example, as shown in FIG. 1, the three light-emitting layers 130 include: a second light-emitting layer 131, a first light-emitting layer 132, and a second light-emitting layer 133 stacked sequentially. In this case, with the central light-emitting layer (i.e., the first light-emitting layer 132) as the center, the three light-emitting layers 131, 132, and 133 are distributed symmetrically. For another example, referring to FIG. 2, the three light-emitting layers 130 include: a first light-emitting layer 134, a second light-emitting layer 135, and a first light-emitting layer 136 stacked sequentially. In this case, with the central light-emitting layer (i.e., the second light-emitting layer 135) as the center, the three light-emitting layers are distributed symmetrically. When the driving voltage increases and the carrier recombination region moves, compared to the case of the light-emitting layers distributed asymmetrically, the change in the ratio of the amounts of the blue light to the second color light emitted by each light-emitting layer is less when the two types of light-emitting layers are symmetrically distributed. In this way, when the driving voltage of the white organic light-emitting device changes (i.e., when the brightness of the white organic light-emitting device changes), the chromaticity is relatively stable for the white light emitted by the white organic light-emitting device.

In some embodiments, referring to FIG. 1, the organic light-emitting device 100 further includes at least one of a hole injection layer 150, a hole transport layer 160, a hole blocking layer 170, an electron transport layer 180, and an electron injection layer 190. Exemplarily, as shown in FIG. 1, the organic light-emitting device 100 includes a hole injection layer 150, a hole transport layer 160, a hole blocking layer 170, an electron transport layer 180, and an electron injection layer 190 that are sequentially disposed on a substrate. The location and arrangement of each layer are shown in FIG. 1.

Exemplarily, the hole injection layer 150 may be a p-type doped layer, including a host material and a p-type dopant material. The host material of the hole injection layer 150 may be NPB, alternatively, may be triphenylamine-based or biphenyl-based materials such as 2-TNATA and m-MTDATA. Among them, the structures of NPB, 2-TNATA, and m-MTDATA are shown below:

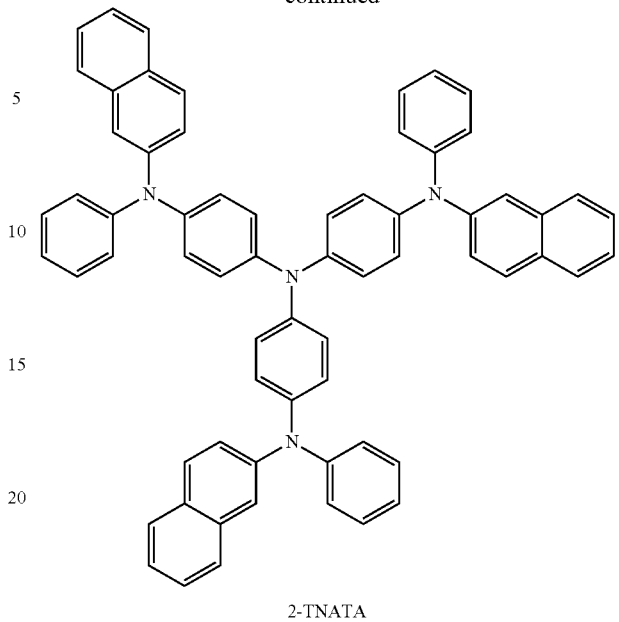

2-TNATA

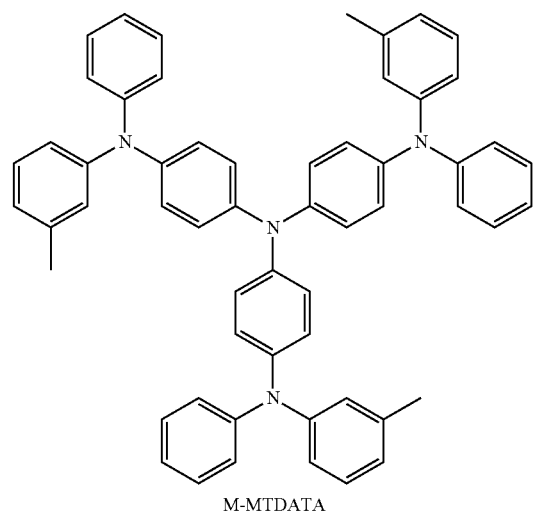

M-MTDATA

The p-type dopant material of the hole injection layer 150 may be a radialene compound having the following general formula, alternatively, may be TCNQ or F4TCNQ:

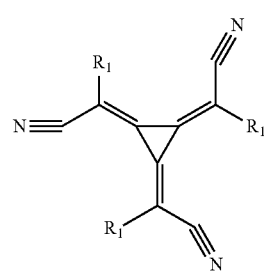

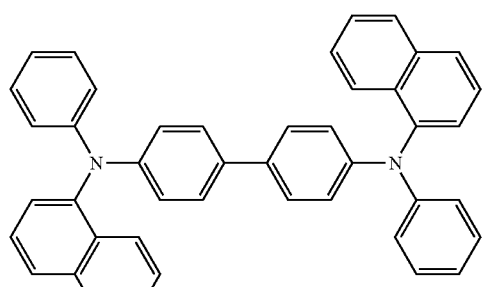

NPB

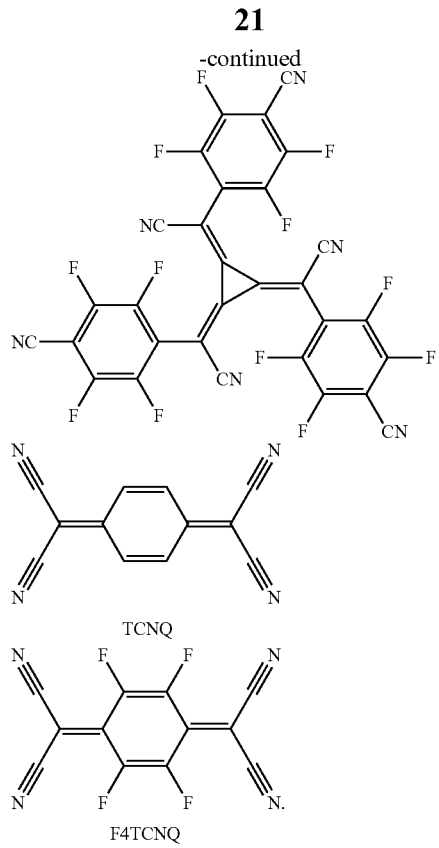

TCNQ

F4TCNQ

The material of the hole transport layer 160 may be NPB, alternatively, may be triphenylamine-based or biphenyl-based materials such as 2-TNATA and m-MTDATA.

The material of the hole blocking layer 170 may be an organic material with a deeper HOMO (Highest Occupied Molecular Orbital) energy level, such as TPBi, and its structural formula is shown below:

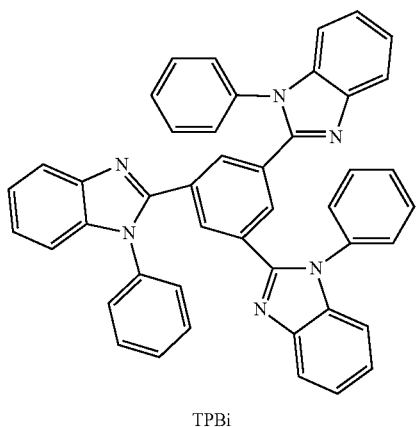

TPBi

For the electron transport layer 180, Liq (8-hydroxy-quinolinato lithium) can be doped into BPhen (4,7-diphenyl-1,10-phenanthroline) to prepare the electron transport layer 180. Among them, the structural formula of Bphen is shown below:

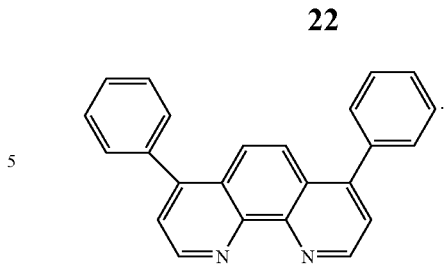

The material of the electron injection layer 190 may be any one of LiF, Liq, $Li_2O$, Li:Alq3 (i.e., Li is doped with Alq3), and Yb. In some embodiments, the material of the electron injection layer 190 is Yb.

In some embodiments, the first electrode 110 is an anode, and the second electrode 120 is a cathode.

The material of the anode may include a transparent conductive oxide material, and the material of the anode may also include a metal material. Among them, the transparent conductive oxide material is, for example, ITO (Indium Tin Oxide) and IZO (Indium Zinc Oxide); and the metal material is, for example, Au, Ag, Ni, and Pt. In some embodiments, the anode is a conductive layer made of transparent conductive oxide. In some embodiments, the structure of the anode is a laminated composite structure comprising transparent conductive oxide/metal/transparent conductive oxide.

The material of the cathode may be metal and/or alloy. Among them, the metal material is, for example, Al, Ag, and Mg; and the alloy material is, for example, a Mg:Ag alloy (i.e., an alloy of Mg and Ag), and an Al:Li alloy (i.e., an alloy of Al and Li).

In some embodiments, the first electrode 110 includes a reflective layer, alternatively, the organic light-emitting device further includes a reflective layer on the side of the first electrode 110 away from the second electrode 120. In addition, the second electrode 120 is a semi-transparent electrode.

Exemplarily, the first electrode 110 is an anode, and the second electrode 120 is a cathode. The structure of the anode includes transparent conductive oxide/metal/transparent conductive oxide, wherein the metal layer is a reflective layer. For example, the anode is ITO/Ag/ITO, and the metallic Ag layer is the reflective layer.

In another example, the anode of the organic light-emitting device is a transparent conductive oxide, such as ITO, and the organic light-emitting device further includes a reflective layer located on the side of the first electrode 110 away from the second electrode 120. For example, the reflective layer may have a material of metal, such as Ag. The cathode is a semi-transparent electrode, and its material is a Mg:Ag alloy (i.e., an alloy of Mg and Ag).

In this case, the organic light-emitting device 100 is a top-emission OLED, and the light emitted by the light-emitting layer 130 is emitted to a side away from the first electrode 110 (i.e., the anode). The light-emitting region of the organic light-emitting device 100 is located in a resonant cavity formed by a total reflection film (i.e., the reflective layer 111 of the first electrode 110) and a semi-reflective film (i.e., a semi-transparent electrode, such as the second electrode 120), in which a microcavity structure is formed between the reflective layer and the semi-transparent electrode. The sides of the reflective layer and the semi-transparent electrode opposite to each other are used as the two reflective surfaces of the microcavity structure. The distance between the reflective layer and the semi-transparent electrode (i.e., the thickness of all layers between the reflective layer and the semi-transparent electrode) is the cavity length of the microcavity structure. When the cavity length is in the same order of magnitude as the wavelength of the light wave, the light of a specific wavelength will be selected and strengthened, and the spectrum will be narrowed. This phenomenon is called the microcavity effect.

In some embodiments, with reference to FIG. 1, the first electrode 110 of the organic light-emitting device 100 includes a reflective layer 111, an ITO layer 112, and an ITO layer 113. The distance Lo (i.e., the cavity length of the microcavity) between the reflective layer and the semi-transparent electrode satisfies: $k \cdot \lambda/2 = La + Lc + n_1 \cdot Lo$, wherein La is a penetration depth on the reflective layer side due to the reflective phase shift of the reflective layer, Lc is a penetration depth on the second electrode side due to the reflective phase shift of the second electrode, k is an integer, λ is a peak wavelength of a blue light emitted by the first light-emitting layer, and $n_1$ is a refractive index of all layers between the reflective layer and the semi-transparent electrode. In this case, due to the microcavity effect, the spectrum of the white light emitted by the organic light-emitting device 100 is narrowed, and the blue light emitted by the first light-emitting layer 132 is strengthened, such that the light-emitting efficiency is improved for the blue light emitted by the device.

In some embodiments, with reference to FIG. 1, in the organic light-emitting device 100, the distance Lo1 between the reflective layer 111 in the first electrode 110 and the first light-emitting layer closest to the reflective layer 111 among the at least two light-emitting layers 130, for example, the first light-emitting layer 132, satisfies:

$$k \cdot \lambda/4 = La + n_2 \cdot Lo1.$$

wherein La is a penetration depth of the reflective layer 111 side due to a reflection phase shift of the reflective layer 111, k is an integer, λ is a peak wavelength of a blue light emitted by the first light-emitting layer 132, and $n_2$ is a refractive index of all layers between the reflective layer 111 and the first light-emitting layer 132. When Lo1 satisfies this formula, the position of the first light-emitting layer 132 can be further adjusted on the basis of the microcavity effect, so that the first light-emitting layer 132 (i.e., the blue light-emitting blue light-emitting layer) is located at the place where the interference is strengthened, further improving the light-emitting efficiency of the blue light emitted by the device.

In some embodiments, with reference to FIG. 1, a light-outgoing layer 140 is provided on the second electrode 120. Exemplarily, the organic light-emitting device 100 is a top-emission OLED, and the light-outgoing layer is provided on the second electrode 120. When light is transmitted through different media, a reflection loss will occur on the interface of the media due to the difference in refractive index. The greater the difference in refractive index, the greater the reflection loss and the more the consumption of the transmitted light. When the light of the OLED is emitted through the cathode, the encapsulation layer, and the cover glass, the significant reflection loss will occur due to the large difference in refractive index between the cathode (refractive index a) and the encapsulation layer (refractive index b). Incorporation of a light-outgoing layer (refractive index c, a>c>b) between the cathode and the encapsulation layer helps to reduce the optical reflection loss. In some embodiments, the light-outgoing layer 140 may have a material of an organic material or an inorganic oxide with a refractive index greater than 1.9 for the blue wavelength band. In some embodiments, the thickness of the light-outgoing layer 140 can be adjusted to a thickness that facilitates the emission of blue light, while also having a certain light-outgoing effect for yellow light. In this way, the chromaticity of the white light emitted by the organic light-emitting device 100 can be balanced.

In some embodiments, the structure of the organic light-emitting device 100 is as shown in FIG. 1, including the first electrode 110, the hole injection layer 150, the hole transport layer 160, the second light-emitting layer 133, the first light-emitting layer 132, the second light-emitting layer 131, the hole blocking layer 170, the electron transport layer 180, the electron injection layer 190, the second electrode 120, and the light outgoing layer 140 that are arranged in sequence from bottom to top.

Among others, the first electrode 110 is an anode, and the structure thereof is a laminated structure of ITO/Ag/ITO. The ITO layer 112 on the side close to the hole injection layer 150 has a thickness of 8 nm.

The host material of the hole injection layer 150 is NPB, which is doped with p-type dopant material at a doping ratio of 2%. The hole injection layer 150 has a thickness of 5 nm. Among others, the doping ratio of the dopant material is the ratio of the volume of the dopant material to the volume of the light-emitting layer. Exemplarily, in the manufacturing process of the functional layer (such as the light-emitting layer, the hole injection layer, the hole transport layer, the hole blocking layer, the electron transport layer, the electron injection layer), two nozzles can be used to spray the dopant material and the host material separately, thereby doping the dopant material in the host material so as to form a functional layer. The volume ratio of the dopant material to the overall functional layer is controlled by controlling the speed of spraying the materials by the two nozzles.

The hole transport layer 160 has a material of NPB, and a thickness of 20 nm.

The second light-emitting layer 133 is a yellow light-emitting layer. Exemplarily, the second light-emitting layer 133 is a yellow phosphorescent light-emitting layer, which comprises host material (i.e., the second host material) shown in the following structural formula:

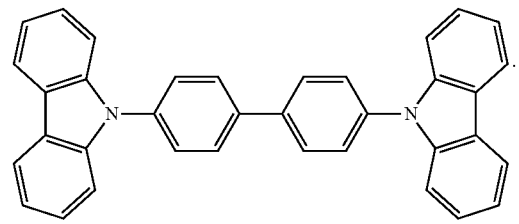 [SMILES: c1ccc2c(c1)c1ccccc1n2-c1ccc(-c2ccc(-n3c4ccccc4c4ccccc43)cc2)cc1]

The structural formula of the dopant material (i.e., the second dopant material) in the second light-emitting layer 133 is shown below:

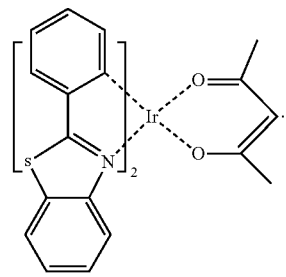

The doping ratio of the dopant material is 8% by volume. The second light-emitting layer 133 has a thickness of 7.5 nm.

The first light-emitting layer 132 is a blue light-emitting layer, which comprises the host material (i.e., the first host material) shown by structural formula below:

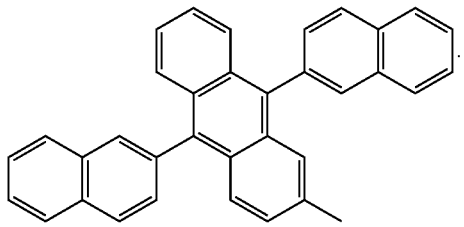 [SMILES: Cc1ccc2c(-c3ccc4ccccc4c3)c3ccccc3c(-c3ccc4ccccc4c3)c2c1]

The structural formula of the dopant material (i.e., the first dopant material) in the second light-emitting layer 132 is shown below:

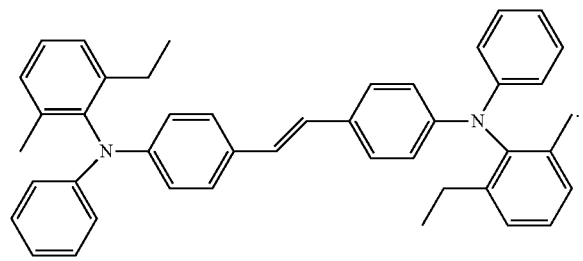 [SMILES: CCc1cccc(C)c1N(c1ccccc1)c1ccc(/C=C/c2ccc(N(c3ccccc3)c3c(C)cccc3CC)cc2)cc1]

The doping ratio of the dopant material is 3% by volume. The first light-emitting layer 132 has a thickness of 10 nm.

The second light-emitting layer 131 is a yellow light-emitting layer. Exemplarily, the second light-emitting layer 131 is a yellow phosphorescent light-emitting layer, and its host material (i.e., the second host material) and dopant material (i.e., the second dopant material) may be the same as those of the second light-emitting layer 133. The doping ratio of the dopant material is 8% by volume. The second light-emitting layer 131 has a thickness of 7.5 nm.

The hole blocking layer 170 has a material of TPBi, and a thickness of 5 nm.

The electron transport layer 180 has a material of Bphen: Liq (i.e., Liq is doped into Bphen), with a ratio of 1:1, and has a thickness of 20 nm.

The electron injection layer 190 has a material of Yb, and a thickness of 1 nm.

The second electrode 120 is a cathode and a semi-transparent electrode, which comprises a Mg:Ag alloy, and has a thickness of 13 nm.

The light-outgoing layer 140 has a material of the corresponding material described above, and has a thickness of 60 nm.

When the organic light-emitting device 100 has the above structure, a microcavity structure is formed between the Ag reflective layer 111 in the first electrode 110 and the second electrode 120. By the formula $k\cdot\lambda/2 = La + Lc + n_1 \cdot Lo$, it is calculated that the theoretical value of Lo may be 80 nm, 208 nm, 336 nm . . . , and as combing the optical simulation with the calculation results of the above formula, as well as the consideration of the complexity of the manufacturing process, it may be obtained that the value of Lo is 80 nm. In this case, the emission of blue light in the device 100 can be enhanced, and the light-emitting efficiency of the blue light emitted by the device is improved, thereby balancing the chromaticity of the white light emitted by the device, and also improving the light-emitting efficiency of the white light emitted by the device. The length of Lo may be adjusted by adjusting the thickness of each layer (i.e., the ITO layer 112, the hole injection layer 150, the hole transport layer 160, the second light-emitting layer 133, the first light-emitting layer 132, the second light-emitting layer 131, the hole blocking layer 170, the electron transport layer 180, and the electron injection layer 190) between the Ag reflective layer 111 in the anode and the semi-transparent electrode (i.e., the second electrode 120). Further, considering the complexity of the process, the length of Lo may be adjusted by adjusting the thickness of the hole transport layer 160. Further experimental adjustments were made to obtain the best experimental thickness, and the value of Lo was 88 nm.

In addition, in the organic light-emitting device 100, by using the formula: $k\cdot\lambda/4 = La + n_2 \cdot Lo1$, it is calculated that the theoretical value of Lo1 may be 40 nm, 126 nm, 212 nm . . . , and as combing the optical simulation with the calculation results of the above formula, as well as the consideration of the complexity of the manufacturing process, it may be obtained that the value of Lo1 is 40 nm. In this case, the position of the first light-emitting layer 132 may be further adjusted on the basis of the microcavity effect, so that the first light-emitting layer 132 (i.e., the blue light-emitting layer) is located at the place where the interference is strengthened, further improving the light-emitting efficiency of the blue light emitted by the device. The length of Lo1 may be adjusted by adjusting the thickness of each layer (i.e., the ITO layer 112, the hole injection layer 150, the hole transport layer 160, and the second light-emitting layer 133) between the Ag reflective layer in the anode and the first light-emitting layer 132. Further, considering the complexity of the process, the length of Lo1 may be adjusted by adjusting the thickness of the hole transport layer 160. Further experimental adjustments were made to obtain the best experimental thickness, and the value of Lo1 was 40.5 nm.

Figure 4:
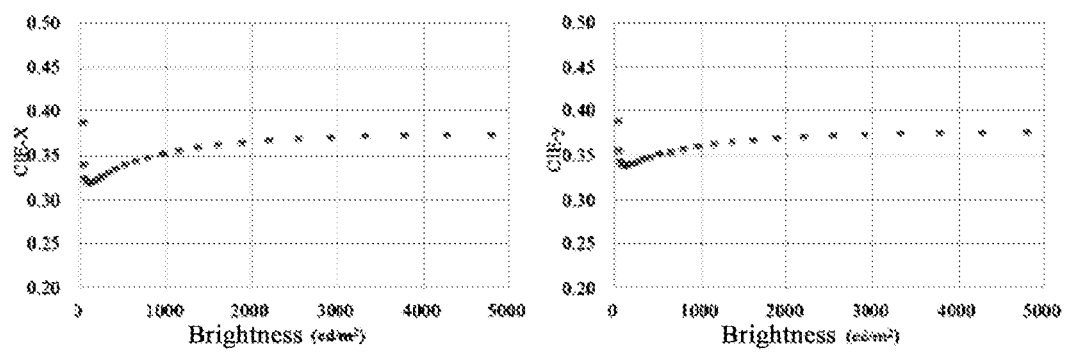
FIG. 4 is a schematic diagram of a performance test result of an organic light-emitting device provided by an embodiment of the disclosure.

The performance was tested for the organic light-emitting device 100 prepared as described above, and the results of the performance test are shown in FIG. 3 and FIG. 4. As shown in FIGS. 3 and 4, the organic light-emitting device 100 has a CIE chromaticity coordinate of (0.3512, 0.3585) at a low brightness, for example, at a brightness of 2000 nit. The white organic light-emitting device 100 can meet the standard of CIE chromaticity coordinates (0.33±0.05, 0.33±0.05) under the brightness of 2000 nit. In addition, when the brightness of the device is increased from 100 nit to 5000 nit, the deviation of chromaticity does not exceed 0.05. The organic light-emitting device 100 can emit white light with good chromaticity, and when the brightness variation range is large for the device, the chromaticity deviation is small, and the chromaticity of the white light emitted by the device is relatively stable.

Figure 2:
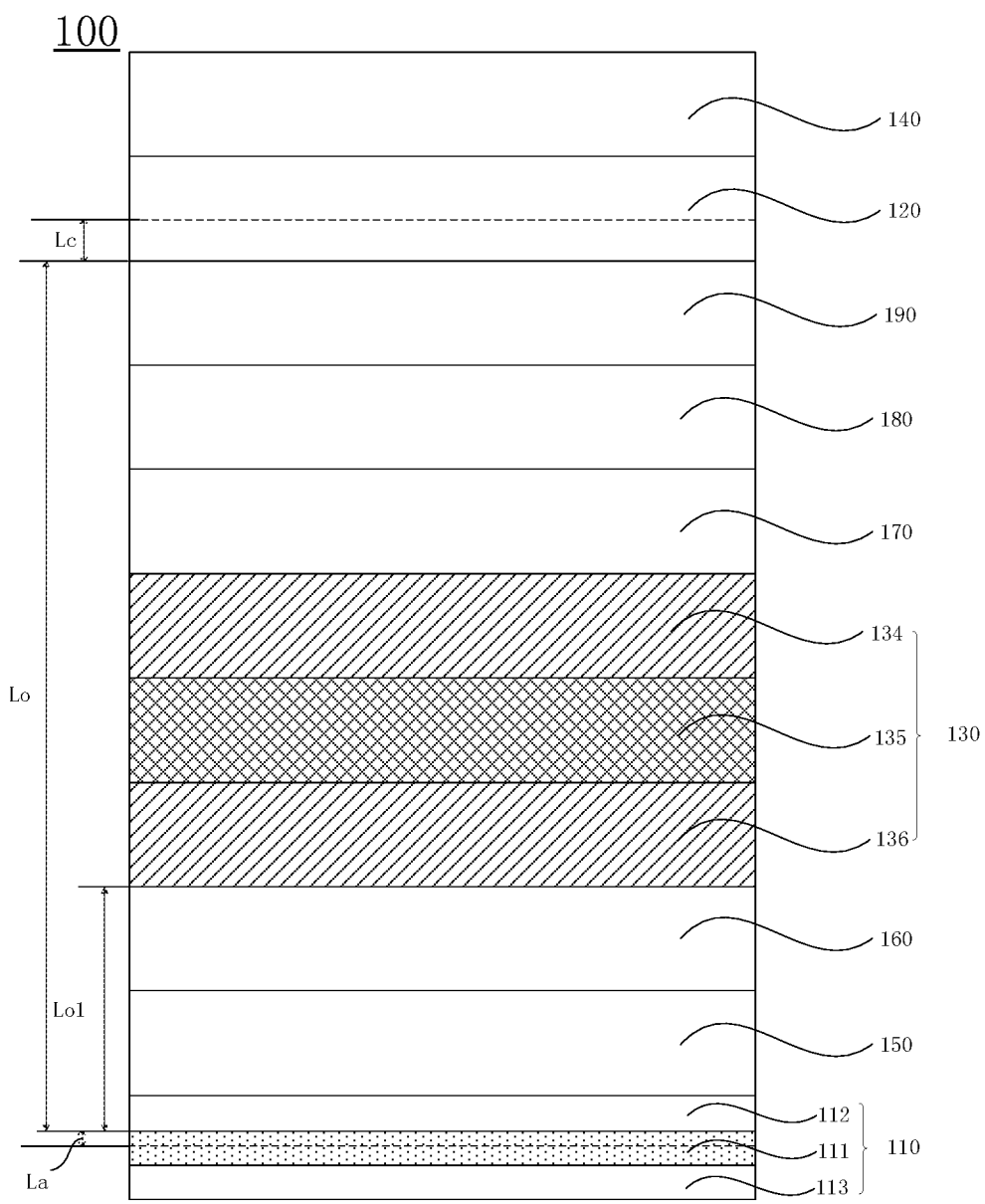
FIG. 2 is a structural diagram of another organic light-emitting device provided by an embodiment of the disclosure.

In some embodiments, the structure of the organic light-emitting device 100 is as shown in FIG. 2, including the first electrode 110, the hole injection layer 150, the hole transport layer 160, the first light-emitting layer 136, the second light-emitting layer 135, the first light-emitting layer 134, the hole blocking layer 170, the electron transport layer 180, the electron injection layer 190, the second electrode 120, and the light-outgoing layer 140 that are arranged in sequence from bottom to top.

Among others, the first electrode 110 is an anode, the structure thereof is an ITO/Ag/ITO structure, and the ITO layer 112 on the side close to the hole injection layer has a thickness of 8 nm.

The host material of the hole injection layer 150 is NPB, which is doped with p-type dopant material at a doping ratio of 2%. The hole injection layer 150 has a thickness of 5 nm.

The hole transport layer 160 has material of NPB, and a thickness of 20 nm.

The first light-emitting layer 136 is a blue light-emitting layer, and the structural formula of the host material (i.e., the first host material) in the first light-emitting layer 136 is shown below:

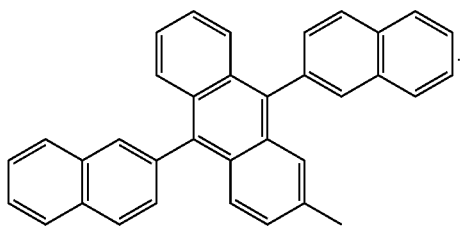 [SMILES: Cc1ccc2c(-c3ccc4ccccc4c3)c3ccccc3c(-c3ccc4ccccc4c3)c2c1]

The structural formula of the dopant material (i.e., the first dopant material) in the first light-emitting layer 136 is shown below:

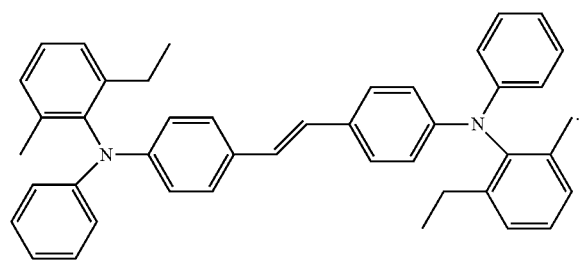 [SMILES: CCc1cccc(C)c1N(c1ccccc1)c1ccc(/C=C/c2ccc(N(c3ccccc3)c3c(C)cccc3CC)cc2)cc1]

The doping ratio of the dopant material is 3% by volume. The first light-emitting layer 136 has a thickness of 7.5 nm.

The second light-emitting layer 135 is a yellow light-emitting layer. Exemplarily, the second light-emitting layer 135 is a yellow phosphorescent light-emitting layer, and the structural formula of the host material (i.e., the second host material) in the second light-emitting layer 135 is shown below:

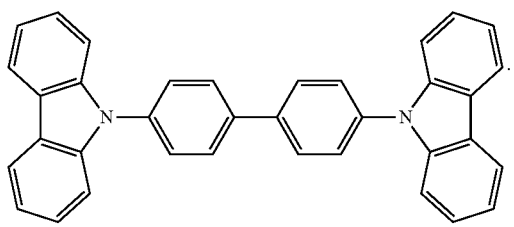 [SMILES: c1ccc2c(c1)c1ccccc1n2-c1ccc(-c2ccc(-n3c4ccccc4c4ccccc43)cc2)cc1]

The structural formula of the dopant material (i.e., the second dopant material) in the second light-emitting layer 135 is shown below:

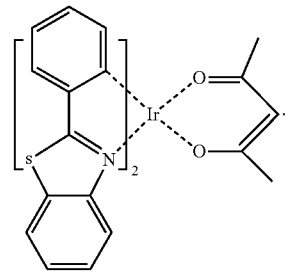

The doping ratio of the dopant material is 8% by volume. The second light-emitting layer 135 has a thickness of 10 nm.

The first light-emitting layer 134 is a blue light-emitting layer, which comprises the same host material (i.e., the first host material) and dopant material (i.e., the first dopant material) as those in the first light-emitting layer 136. The doping ratio of the dopant material is 3% by volume. The first light-emitting layer 134 has a thickness of 7.5 nm.

The hole blocking layer 170 has a material of TPBi, and a thickness of 5 nm.

The electron transport layer 180 has a material of Bphen: Liq (i.e., Liq is doped into Bphen) at s ratio of 1:1, and has a thickness of 20 nm.

The electron injection layer 190 has a material of Yb, and a thickness of 1 nm.

The second electrode 120 is a cathode and a semi-transparent cathode, which comprise the material of a Mg:Ag alloy (i.e., an alloy of Mg and Ag), and has a thickness of 13 nm.

The light-outgoing layer 140 has a material of the corresponding material described above, and has a thickness of 60 nm.

When the organic light-emitting device 100 has the above structure, a microcavity structure is formed between the Ag reflective layer 111 in the anode and the second electrode 120. By using the formula $k \cdot \lambda/2 = La + Lc + n_1 \cdot Lo$, it is calculated that the theoretical value of Lo may be 80 nm, 208 nm, 336 nm . . . , and as combining the optical simulation with the calculation results of the above formula, as well as the consideration of the complexity of the manufacturing process, it may be obtained that the value of Lo is 80 nm. In this case, the emission of blue light in the device 100 can be enhanced, and the light-emitting efficiency of the blue light emitted by the device is improved, thereby balancing the chromaticity of the white light emitted by the device, and also improving the light-emitting efficiency of the white light emitted by the device. The length of Lo may be adjusted by adjusting the thickness of each layer (i.e., the ITO layer 112, the hole injection layer 150, the hole transport layer 160, the first light-emitting layer 136, the second light-emitting layer 135, the first light-emitting layer 134, the hole blocking layer 170, the electron transport layer 180, and the electron injection layer 190) between the Ag reflective layer 111 in the anode and the semi-transparent electrode (i.e., the second electrode 120). Further, considering the complexity of the process, the length of Lo may be adjusted by adjusting the thickness of the hole transport layer 160. Further experimental adjustments were made to obtain the best experimental thickness, and the value of Lo was 88 nm.

The performance was tested for the organic light-emitting device 100 shown in FIG. 2, and the result of the performance test is shown in FIG. 5. As shown in FIG. 5, the organic light-emitting device 100 has a CIE chromaticity coordinate of (0.2807, 0.3052) at a low brightness, for example, at a brightness of 2000 nit. The organic light-emitting device 100 can meet the standard of CIE chromaticity coordinate (0.33±0.05, 0.33±0.05) at the brightness of 2000 nit. The organic light-emitting device 100 can emit white light with good chromaticity.

In addition, on this basis, in the organic light-emitting device 100, by using the formula: $k \cdot \lambda/4 = La + n_2 \cdot Lo1$, it is calculated that the theoretical value of Lo1 can be 40 nm, 126 nm, 212 nm . . . , and as combing the optical simulation with the calculation results of the above formula, as well as the consideration of the complexity of the manufacturing process, it may be obtained that the value of Lo1 is 40 nm. In this case, the position of the first light-emitting layer 132 may be further adjusted on the basis of the microcavity effect, so that the first light-emitting layer 136 is located at the place where the interference is strengthened, further improving the light-emitting efficiency of the blue light emitted by the device. Exemplarily, the length of Lo1 which corresponds to the first light-emitting layer 136 can be adjusted by adjusting the thickness of each layer (i.e., the ITO layer 112, the hole injection layer 150, and the hole transport layer 16) between the Ag reflective layer 111 in the anode and the first light-emitting layer 136. Further, considering the complexity of the process, the length of Lo1 which corresponds to the first light-emitting layer 136 may be adjusted by adjusting the thickness of the hole transport layer 160. Further experimental adjustments were made to obtain the best experimental thickness, and the value of Lo1 which corresponds to the first light-emitting layer 136 was 40 nm. The thickness of the hole transport layer 160 may be adjusted to 27 nm so as to adjust the Lo1 which corresponds to the first light-emitting layer 136 to 40 nm, and the thickness of the electron transport layer 180 may be adjusted to 13 nm accordingly to ensure that Lo remains unchanged, so that the microcavity effect still exists. In this way, the first light-emitting layer 136 is located at the place where the interference is enhanced, which can further improve the light-emitting efficiency of the blue light emitted by the device. For the first light-emitting layer 134, the distance between the first light-emitting layer 134 and the first electrode 110 can also be adjusted according to the above formula, so that the first light-emitting layer 134 is also located at the place where the interference is strengthened. The specific principle is similar to the related arrangement of the first light-emitting layer 136, and will not be repeated here.

The embodiments of the present disclosure also provide a method for manufacturing an organic light-emitting device. In some embodiments, the method can be used to prepare the organic light-emitting device provided in any embodiments of the present disclosure.

Figure 6:
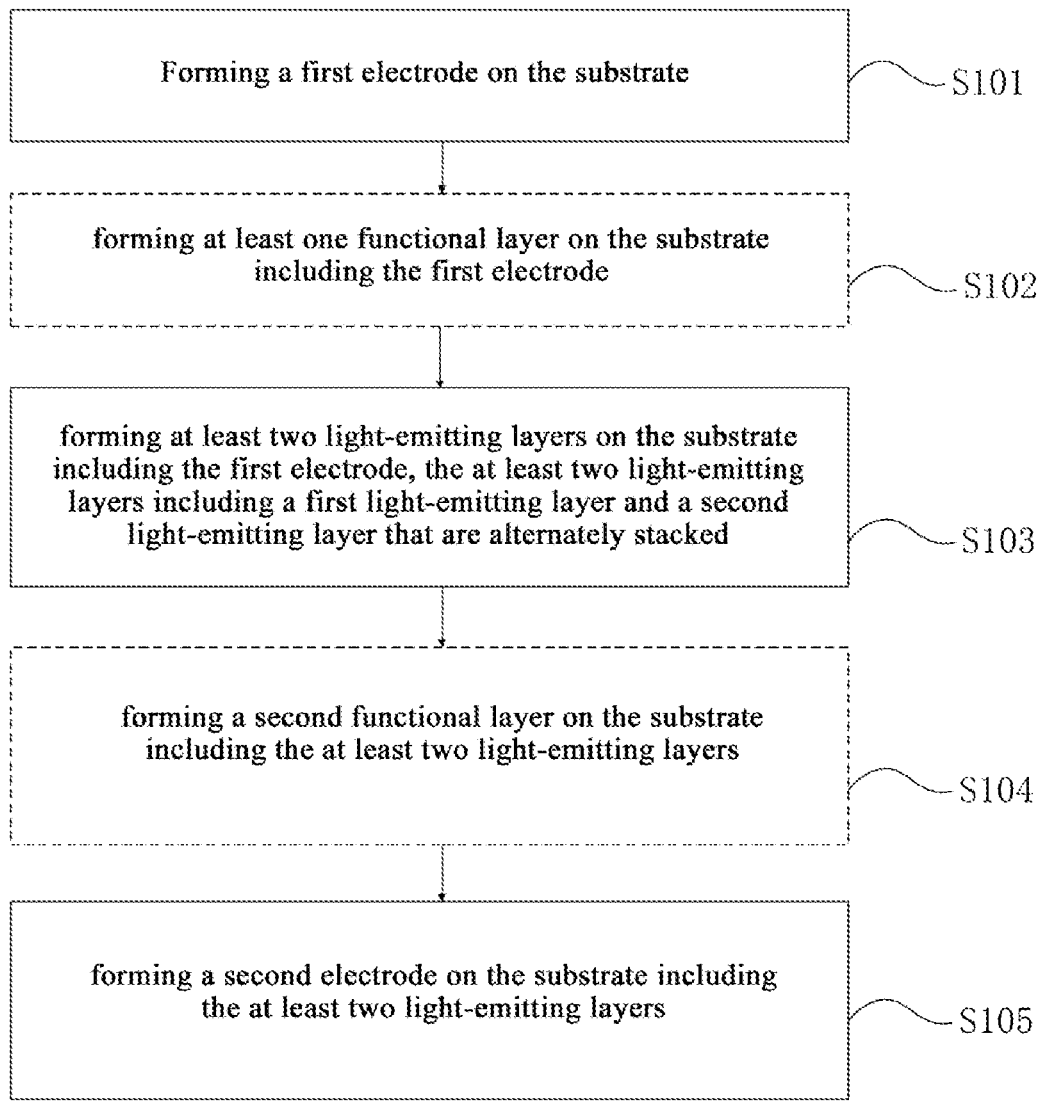
FIG. 6 is a flowchart showing a manufacturing method of an organic light-emitting device provided by an embodiment of the disclosure.

With reference to FIG. 6, the method for manufacturing the organic light-emitting device provided by the embodiment of the present disclosure includes:

S101, forming a first electrode on a substrate.

S102 (optional), forming at least one first functional layer on the substrate including the first electrode.

In some embodiments, the first functional layer may include at least one of a hole injection layer and a hole transport layer.

S103, forming at least two light-emitting layers on the substrate including the first electrode, the at least two light-emitting layers including a first light-emitting layer and a second light-emitting layer that are stacked alternately.

In some embodiments, the method for manufacturing the organic light-emitting device includes S102, and the prepared organic light-emitting device further includes at least one first functional layer. In this case, at least two light-emitting layers are formed on the first functional layer away from the first electrode among the first functional layers, so that the light-emitting layer covers a part of or entire of the first functional layer. Exemplarily, the organic light-emitting device includes a first electrode, a hole injection layer, and a hole transport layer sequentially formed from bottom to top. At least two light-emitting layers are formed on the hole transport layer, so that the light-emitting layer covers a part of or entire of the hole transport layer. In some embodiments, the method for manufacturing the organic light-emitting device does not include S102. In this case, the at least two light-emitting layers may be formed on the first electrode, so that the light-emitting layer covers a part of or entire of the first electrode.

S104 (optional), forming at least one second functional layer on the substrate including the at least two light-emitting layers.

In some embodiments, the second functional layer may include at least one of a hole blocking layer, an electron transport layer, and an electron injection layer.

S105, forming a second electrode on the substrate including at least two light-emitting layers.

In some embodiments, the method for manufacturing the organic light-emitting device includes S104, and the prepared organic light-emitting device further includes at least one second functional layer. In this case, a second electrode is formed on the second functional layer away from the first electrode among the second functional layers, so that the second electrode covers a part of or entire of the second functional layer. Exemplarily, the organic light-emitting device includes a first electrode, a hole injection layer, a hole transport layer, at least two light-emitting layers, a hole blocking layer, an electron transport layer, and an electron injection layer that are sequentially formed from bottom to top. In this case, a second electrode is formed on the electron injection layer, so that the second electrode covers a part of or entire of the electron injection layer. In some embodiments, the method for manufacturing the organic light-emitting device does not include S104. In this case, the second electrode may be formed on the light-emitting layer away from the first electrode among the at least two light-emitting layers, so that the second electrode covers a part of or entire of the light-emitting layer.

In the above manufacturing method, among the at least two light-emitting layers, the first light-emitting layer is a blue light-emitting layer, and the blue light-emitting layer is doped with a first dopant material; the first dopant material may include the blue light-emitting material having a triplet-triplet annihilation effect. The second light-emitting layer is doped with a second dopant material. In addition, the triplet energy level of the first dopant material is higher than the triplet energy level of the second dopant material.

In an embodiment, with reference to FIG. 1 and FIG. 6, the process for manufacturing the organic light-emitting device 100 is as follows:

The first electrode 110 is formed on the substrate, and the substrate with the first electrode 110 is ultrasonically processed in deionized water for 5 minutes, ultrasonically processed in isopropanol for 5 minutes, and then ultrasonically processed in deionized water for 10 minutes. Then, the resulted structure is placed in an oven of 120° C. for 1 hour and then taken out for later use.

The cleaned and dried substrate with anode is placed in the evaporation deposition equipment of the organic light-emitting device. When the vacuum degree reaches $5*10^{-4}$ Pa, the hole injection layer is deposited, with the material composition of NPB: 2% p-type dopant material (i.e., p-type dopant material is doped into NPB with the doping ratio of 2% by volume), and the deposition thickness of 5 nm, wherein the deposition rate of NPB is 1 Å/s, and the deposition rate of p-type dopant material is 0.02 Å/s. Then the hole transport layer is deposited, with the material of NPB, the deposition thickness of 20 nm, and the deposition rate of 1 Å/s to 2 Å/s.

Then, the substrate with the hole transport layer 160 is transferred to the chamber for depositing the light-emitting layer, and the second light-emitting layer 133, the first light-emitting layer 132, and the second light-emitting layer 133 are sequentially deposited on the hole transport layer 160. The second light-emitting layer 133, the first light-emitting layer 132, and the second light-emitting layer 133 have a thickness of 7.5 nm, 10 nm, and 7.5 nm, respectively. Among others, when the second light-emitting layer 133 and the second light-emitting layer 131 are deposited, the deposition rate of the second host material is 1 Å/s, and the deposition rate of the second dopant material is 0.08 Å/s; when the first light-emitting layer 132 is deposited, the deposition rate of the first host material is 1 Å/s, and the deposition rate of the first dopant material is 0.03 Å/s. The substrate with the light-emitting layers is transferred to the chamber for depositing the electron transport layer to deposit the hole blocking layer 170, in which the deposited material is TPBi, the thickness is 5 nm, the deposition rate is 0.5 Å/s, and then deposit the electron transport layer 180, in which the deposited material is Bphen:Liq, and the deposition rate is 0.5 Å/s.

Finally, the substrate with the electron transport layer 180 is transferred to the chamber for metal deposition, in which the electron injection layer 190 is deposited. In addition, the second electrode 120 is deposited, the material of which is Mg:Ag alloy. Finally, the light-outgoing layer 140 is deposited.

Another aspect of the present disclosure provides a display device. The display device may include any of the above-mentioned organic light-emitting devices. For example, the organic light-emitting device may be a white light organic light-emitting device.

The display device may be a product with image display function, such as monitor, TV, billboard, digital photo frame, laser printer with display function, telephone, mobile phone, personal digital assistant (PDA), digital camera, portable camcorders, viewfinders, navigators, vehicles, large-area walls, home appliances, information query equipment (such as a business query equipment for government, banking, hospital, electric power and other department) and monitors etc.

The display device may include a display panel, and the display device may further include a driving circuit coupled with the display panel, and the driving circuit is configured to provide an electric signal to the display panel.

Figure 7:
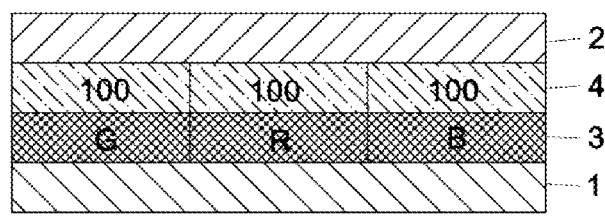
FIG. 7 is a structural diagram of the displaying device provided by one embodiment of the disclosure.

In some embodiments, the display panel may be an OLED (Organic Light-Emitting Diode) display panel. Exemplarily, the OLED display panel may include a plurality of any of the above-mentioned organic light-emitting devices, and the light-emitting brightness of each organic light-emitting device is adjustable, so that a grayscale image can be displayed. In another example, with reference to FIG. 7, the OLED display panel may include a substrate 1, a light-emitting functional layer 4 (including a plurality of organic light-emitting devices 100) and color filters 3 (for example, the three primary color filters 3 including a red filter R, a green filter G, and a blue filter B) located on the light-outgoing side of the plurality of organic light-emitting devices 100 and a package substrate 2, so that the white light with a certain brightness emitted from each organic light-emitting device may present a primary color after passing through the color filter, so that the OLED display panel can display color images.

Figure 8:
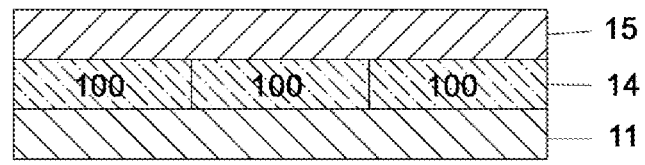
FIG. 8 is a structural diagram of the displaying device provided by another embodiment of the disclosure.

In other embodiments, the display device may include an LCD (Liquid Crystal Display). With reference FIG. 8, the display panel in the display device is a liquid crystal display panel 15. In this case, the display device may also include a backlight source 14 for providing a backlight for the liquid crystal display panel 15. Among others, the backlight source may include a plurality of organic light-emitting devices 100 described above.

Finally, it should be noted that the above embodiments are only used to illustrate the technical solutions of the present disclosure, without limiting them; although the present disclosure has been described in detail with reference to the foregoing embodiments, those of ordinary skill in the art should understand that: the technical solutions recorded in the foregoing embodiments may be further modified, or some of the technical features thereof may be equivalently replaced; and these modifications or replacements do not cause the essence of the corresponding technical solutions to deviate from the spirit and scope of the technical solutions of the embodiments of the present disclosure.

What is claimed is:

1. An organic light-emitting device, comprising:
   a first electrode and a second electrode arranged oppositely;
   at least two light-emitting layers between the first electrode and the second electrode, the at least two light-emitting layers comprise: a first light-emitting layer and a second light-emitting layer that are stacked alternately;
   the first light-emitting layer is a blue light-emitting layer, and the first light-emitting layer is doped with a first dopant material;
   the second light-emitting layer is doped with a second dopant material;
   the first dopant material comprises a blue light-emitting material with triplet-triplet annihilation effect, and the triplet energy level of the first dopant material is higher than the triplet energy level of the second dopant material,
   wherein the organic light-emitting device further comprises a reflective layer located on a side of the first electrode away from the second electrode; and the second electrode is a semi-transparent electrode,
   wherein a distance Lo between the reflective layer and the semi-transparent electrode satisfies: $k \cdot \lambda/2 = La + Lc + n_1 \cdot Lo$,
   wherein La is a penetration depth on the reflective layer side due to the reflective phase shift of the reflective layer, Lc is a penetration depth on the second electrode side due to the reflective phase shift of the second electrode, k is an integer, $\lambda$ is a peak wavelength of a blue light emitted by the first light-emitting layer, and $n_1$ is a refractive index of all layers between the reflective layer and the semi-transparent electrode.

2. The organic light-emitting device according to claim 1, wherein the second light-emitting layer is selected from a group consisting of a yellow light-emitting layer, a red light-emitting layer, and an orange light-emitting layer.

3. The organic light-emitting device according to claim 1, wherein the at least two light-emitting layers have a layer number of an odd number.

4. The organic light-emitting device according to claim 3, wherein the at least two light-emitting layers comprise light-emitting layers selected from a group consisting of:

the first light-emitting layer, the second light-emitting layer, and the first light-emitting layer that are stacked sequentially; and the second light-emitting layer, the first light-emitting layer, and the second light-emitting layer that are stacked sequentially.

5. The organic light-emitting device according to claim 1, wherein the triplet energy level of the first dopant material is greater than or equal to 2.2 eV.

6. The organic light-emitting device according to claim 1, wherein the first dopant material is at least one selected from the group consisting of compounds represented by any of the following structural formulas:

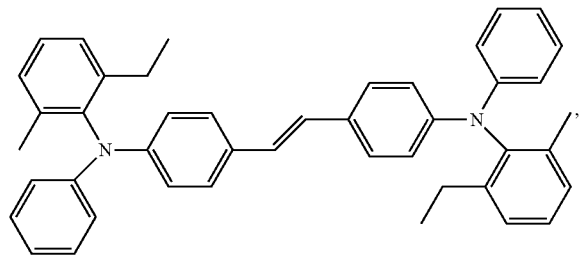

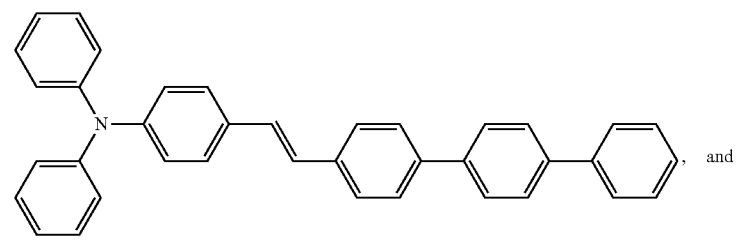, and

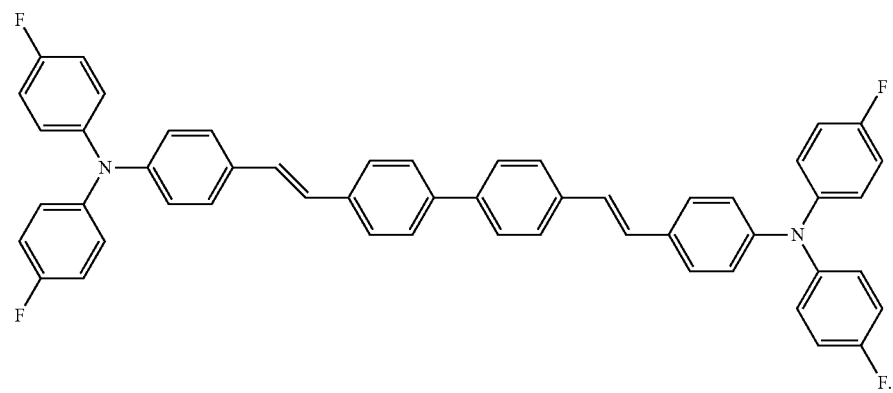

7. The organic light-emitting device according to claim 1, wherein the second dopant material is at least one selected from the group consisting of compounds represented by any of the following structural formulas:

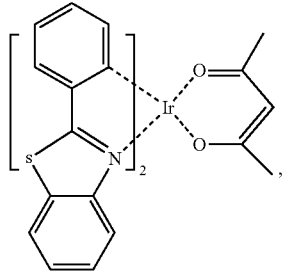

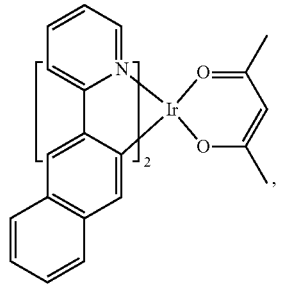

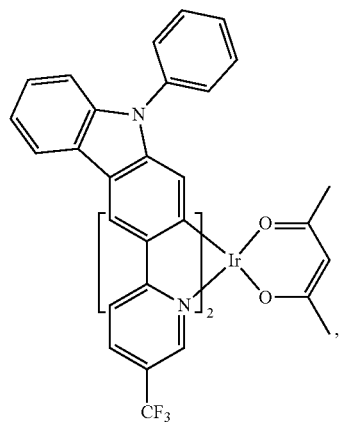

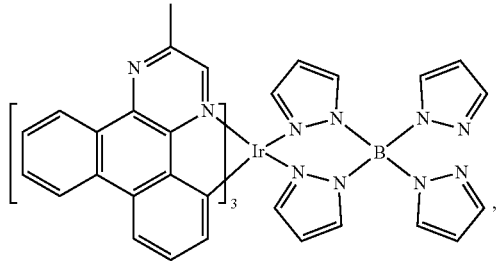

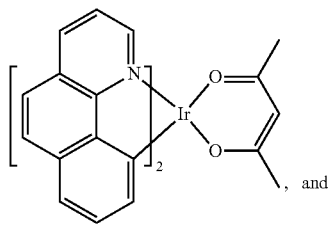, and

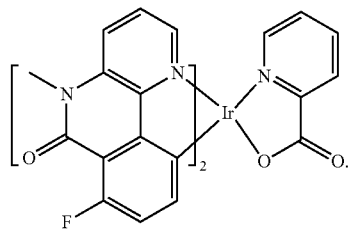

8. The organic light-emitting device according to claim 1, wherein:
a distance Lo1 between the reflective layer and the first light-emitting layer closest to the reflective layer among the at least two light-emitting layers satisfies:
$k \cdot \lambda/4 = La + n_2 \cdot Lo1$,
wherein La is a penetration depth of the reflective layer side due to a reflection phase shift of the reflective layer, k is an integer, $\lambda$ is a peak wavelength of a blue light emitted by the first light-emitting layer, and $n_2$ is a refractive index of all layers between the reflective layer and the first light-emitting layer.

9. The organic light-emitting device of claim 1, further comprising: at least one selected from a group consisting of a hole injection layer, a hole transport layer, a hole blocking layer, an electron transport layer, and an electron injection layer.

10. The organic light-emitting device according to claim 1, wherein:
a light-outgoing layer is provided on the second electrode.

11. The organic light-emitting device according to claim 1, wherein the first light-emitting layer further comprises a first host material, the first dopant material is doped in the first host material, and the first host material is selected from one or a mixture of several of the compounds represented by any of the following structural formulas:

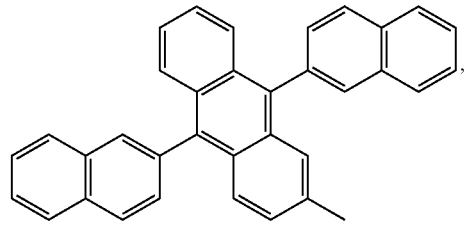

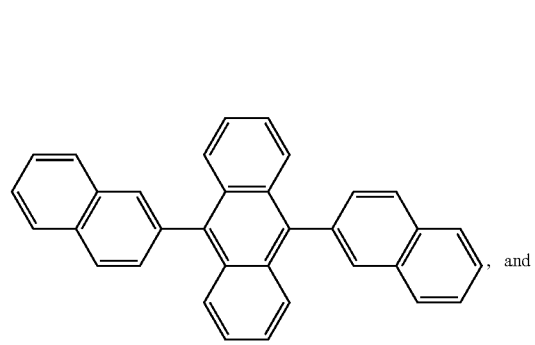, and

-continued

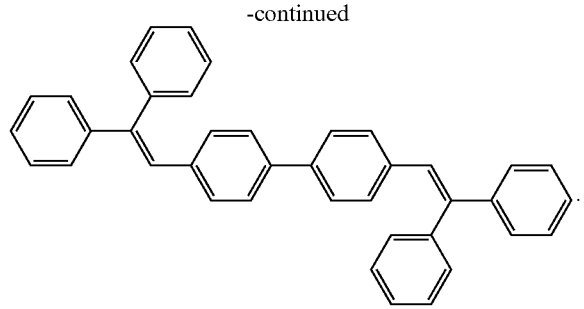

12. The organic light-emitting device according to claim 1, wherein the second light-emitting layer further comprises a second host material, the second dopant material is doped in the second host material, and the second host material is selected from one or a mixture of several of the compounds represented by any of the following structural formulas:

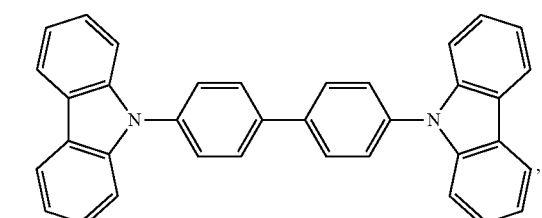

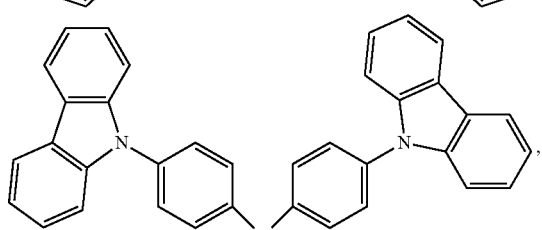

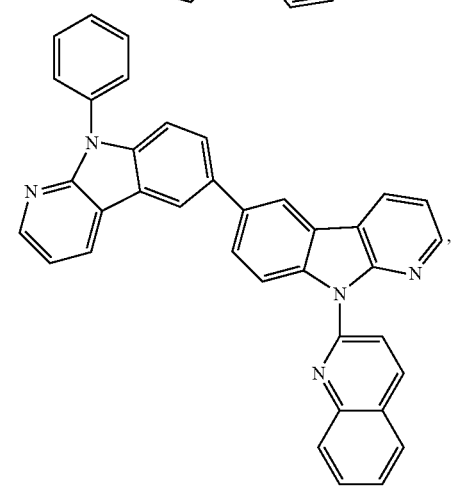

-continued

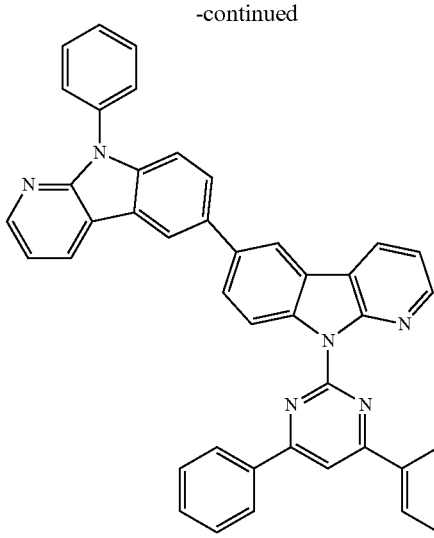

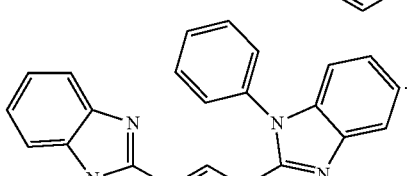

, and

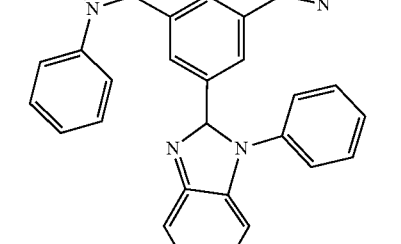

13. The organic light-emitting device according to claim 9, wherein the organic light-emitting device is a white light organic light-emitting device, and the white light organic light-emitting device comprises the first electrode, a hole injection layer, a hole transport layer, the second light-emitting layer, the first light-emitting layer, the second light-emitting layer, a hole blocking layer, an electron transport layer, an electron injection layer, the second electrode and a light-outgoing layer sequentially arranged on a substrate.

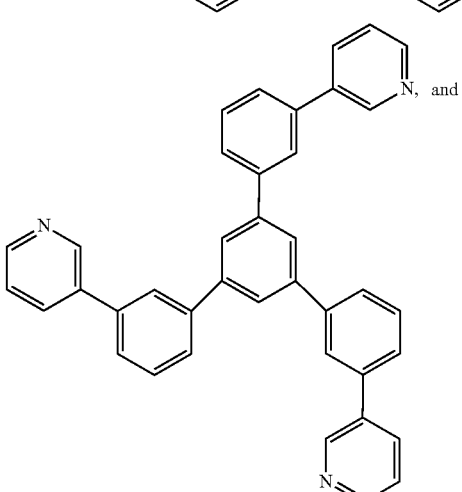

14. A display device comprising the organic light-emitting device of claim 1.

15. The display device according to claim 14, wherein the organic light-emitting device is a white light organic light-emitting device, the display device has a display panel of an organic light-emitting diode display panel, and the organic light-emitting diode display panel comprises a plurality of the white light organic light-emitting devices.

16. The display device according to claim 14, wherein the organic light-emitting device is a white light organic light-emitting device, the display device comprises a liquid crystal display panel and a backlight source for providing a backlight for the liquid crystal display panel, and the backlight source comprises a plurality of the white light organic light-emitting devices.

17. A method for preparing an organic light-emitting device, comprising the following steps:
    forming a first electrode on a substrate;
    forming at least two light-emitting layers on the substrate comprising the first electrode, the at least two light-emitting layers comprising: a first light-emitting layer and a second light-emitting layer that are stacked alternately;
    forming a second electrode on the substrate comprising the at least two light-emitting layers;

wherein, the first light-emitting layer is a blue light-emitting layer, the blue light-emitting layer is doped with a first dopant material; the second light-emitting layer is doped with a second dopant material; the first dopant material comprises a blue light-emitting material with triplet-triplet annihilation effect; and the triplet energy level of the first dopant material is higher than the triplet energy level of the second dopant material, wherein the method further comprises: forming a reflective layer located on a side of the first electrode away from the second electrode; wherein the second electrode is a semi-transparent electrode, and a distance Lo between the reflective layer and the semi-transparent electrode satisfies: $k \cdot \lambda/2 = La + Lc + n_1 \cdot Lo$, wherein La is a penetration depth on the reflective layer side due to the reflective phase shift of the reflective layer, Lc is a penetration depth on the second electrode side due to the reflective phase shift of the second electrode, k is an integer, $\lambda$ is a peak wavelength of a blue light emitted by the first light-emitting layer, and $n_1$ is a refractive index of all layers between the reflective layer and the semi-transparent electrode.

* * * * *